United States Patent
Lee et al.

(10) Patent No.: US 10,910,077 B2
(45) Date of Patent: Feb. 2, 2021

(54) OPERATION METHOD OF A NONVOLATILE MEMORY DEVICE FOR CONTROLLING A RESUME OPERATION

(71) Applicant: SAMSUNG ELECTRONICS CO., LTD., Suwon-si (KR)

(72) Inventors: Ji-Sang Lee, Iksan-si (KR); Ji-Ho Cho, Suwon-si (KR); Byung-Soo Kim, Yongin-si (KR); Dong-Jin Shin, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/561,570

(22) Filed: Sep. 5, 2019

(65) Prior Publication Data

US 2019/0392910 A1    Dec. 26, 2019

Related U.S. Application Data

(63) Continuation of application No. 15/825,786, filed on Nov. 29, 2017, now Pat. No. 10,431,315.

(Continued)

(30) Foreign Application Priority Data

Feb. 17, 2017    (KR) .................. 10-2017-0021728

(51) Int. Cl.
*G11C 16/04* (2006.01)
*G11C 16/34* (2006.01)
*G11C 16/10* (2006.01)
*G11C 16/16* (2006.01)
*G11C 16/14* (2006.01)
*G11C 11/56* (2006.01)

(52) U.S. Cl.
CPC .......... *G11C 16/3459* (2013.01); *G11C 16/10* (2013.01); *G11C 16/14* (2013.01); *G11C 16/16* (2013.01); *G11C 16/3445* (2013.01); *G11C 11/5671* (2013.01); *G11C 16/0483* (2013.01); *G11C 2211/5621* (2013.01)

(58) Field of Classification Search
CPC ..... G11C 16/3459; G11C 16/10; G11C 16/16; G11C 16/14; G11C 16/3445; G11C 11/5671; G11C 16/0483; G11C 2211/5621; G11C 16/08; G11C 16/26
See application file for complete search history.

(56) References Cited

U.S. PATENT DOCUMENTS 7,593,266 B2    9/2009 Senoo et al.
8,335,113 B2    12/2012 Terauchi
(Continued)

FOREIGN PATENT DOCUMENTS

JP    2008-034045    2/2008

*Primary Examiner* — Uyen Smet
(74) *Attorney, Agent, or Firm* — F. Chau & Associates, LLC

(57) ABSTRACT

An operation method of a nonvolatile memory device for programming memory cells connected to a selected word line, the method including: performing a program operation; suspending the program operation after performing a first portion of the program operation; and resuming the program operation to perform a second portion of the program operation, wherein the program operation is resumed within a reference time after the program operation is suspended.

29 Claims, 30 Drawing Sheets

Related U.S. Application Data

(60) Provisional application No. 62/427,427, filed on Nov. 29, 2016.

(56) References Cited

U.S. PATENT DOCUMENTS

| | | |
|---|---|---|
| 8,364,888 B2 | 1/2013 | Melik-Martirosian et al. |
| 9,293,206 B2 | 3/2016 | Nam |
| 9,401,215 B2 | 7/2016 | Jung |
| 2012/0201082 A1 | 8/2012 | Choy et al. |
| 2015/0221381 A1 | 8/2015 | Nam |
| 2015/0355854 A1 | 12/2015 | Song et al. |
| 2016/0012902 A1 | 1/2016 | Harada et al. |
| 2017/0194053 A1* | 7/2017 | Micheloni .............. G11C 5/005 |
| 2017/0285969 A1 | 10/2017 | Madraswala et al. |
| 2018/0151237 A1 | 5/2018 | Lee et al. |

\* cited by examiner

OPERATION METHOD OF A NONVOLATILE MEMORY DEVICE FOR CONTROLLING A RESUME OPERATION

CROSS-REFERENCE TO RELATED APPLICATIONS

This application is a continuation of U.S. patent application Ser. No. 15/825,786 filed Nov. 29, 2017, which claims priority under 35 U.S.C. § 120 to U.S. Provisional Patent Application No. 62/427,427, filed on Nov. 29, 2016, in the U.S. Patent and Trademark Office, and priority under 35 U.S.C. § 119 to Korean Patent Application No. 10-2017-0021728, filed on Feb. 17, 2017, in the Korean Intellectual Property Office, the disclosures of which are incorporated by reference herein in their entireties.

TECHNICAL FIELD

Exemplary embodiments of the inventive concept relate to a semiconductor memory, and more particularly, to an operation method of a nonvolatile memory device for controlling a resume operation.

DISCUSSION OF RELATED ART

Flash memory is a nonvolatile storage medium that can be erased and reprogrammed. Due to characteristics such as high capacity, low noise and low power, flash memory is used in various memory systems. In the flash memory, program and erase operations are performed for a relatively long time. Access to the flash memory for data retrieval may not be allowed until a program or erase operation ends. In this case, performance of a memory system may be degraded.

To retrieve data from the flash memory, the memory system may perform a suspend operation to suspend a program or erase operation that is currently being performed, and then, perform a read operation for data retrieval. After retrieving the data, the memory system may perform a resume operation to resume the suspended program or erase operation according to a resume command. A frequency of suspend and resume operations may be determined by a quality of service (QoS) required for the memory system. If the QoS requires a maximum of 1 ms as a read latency for data retrieval, it may take almost 1 ms to suspend a program or erase operation and complete a read operation.

However, a threshold voltage distribution of memory cells of the flash memory may be shifted after a program operation. In particular, when a program operation is suspended by a read operation for data retrieval and then resumes, a program time may increase by a time taken for the read operation. If the program time is increased by a resume time after the program operation is suspended until the program operation resumes, the threshold voltage distribution of memory cells may be transformed, and thus, the program operation may fail.

SUMMARY

According to an exemplary embodiment of the inventive concept, there is provided an operation method of a nonvolatile memory device for programming memory cells connected to a selected word line, the method including: performing a program operation; suspending the program operation after performing a first portion of the program operation; and resuming the program operation to perform a second portion of the program operation, wherein the program operation is resumed within a reference time after the program operation is suspended.

According to an exemplary embodiment of the inventive concept there is provided an operation method of a nonvolatile memory device for erasing a selected memory block from among a plurality of memory blocks, the method including: performing an erase operation; suspending the erase operation after performing a first portion of the erase operation; and resuming the erase operation to perform a second portion of the erase operation, wherein the erase portion is resumed within a reference time after the erase operation is suspended.

According to an exemplary embodiment of the inventive concept, there is provided an operation method of a nonvolatile memory device for programming memory cells connected to a selected word line by sequentially performing a plurality of program loops, the method including: performing a first portion of a program operation, wherein the program operation comprises at least one of the plurality of program loops; suspending the program operation after the performing of the first portion of the program operation; and resuming the program operation after the suspending of the program operation, wherein the program operation is resumed for the selected word line or a word line different than the selected word line, according to a resume time from after the program operation is suspended until the program operation resumes.

According to an exemplary embodiment of the inventive concept, there is provided an operation method of a nonvolatile memory device for erasing a selected memory block from among a plurality of memory blocks by sequentially performing a plurality of erase loops, the method including: performing a first portion of an erase operation, wherein the erase operation comprises at least one of the plurality of erase loops; suspending the erase operation after the performing of the first portion of the erase operation; and resuming the erase operation after the suspending of the erase operation, wherein the remainder of the plurality of erase loops are performed according to a resume time from after the erase operation is suspended until the erase operation resumes, or all of the plurality of erase loops are performed again from the beginning of the sequence.

According to an exemplary embodiment of the inventive concept, there is provided a memory controller for controlling an operation of a nonvolatile memory device, the memory controller configured to: control a program operation of a selected word line from among a plurality of word lines of the nonvolatile memory device; suspend the program operation in response to an external retrieve request; and resume the program operation on the selected word line or a word line different than the selected word line according to a resume time measured from after the program operation is suspended until the program operation resumes.

According to an exemplary embodiment of the inventive concept, there is provided a memory controller for controlling an operation of a nonvolatile memory device, the memory controller configured to: control an erase operation of a selected memory block from among a plurality of memory blocks of the nonvolatile memory device; suspend the erase operation in response to an external retrieve request; and resume the erase operation to perform a remaining erase operation of the selected memory block according to a resume time measured from after the erase operation is suspended until the erase operation resumes, or to start the erase operation of the selected memory block again.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
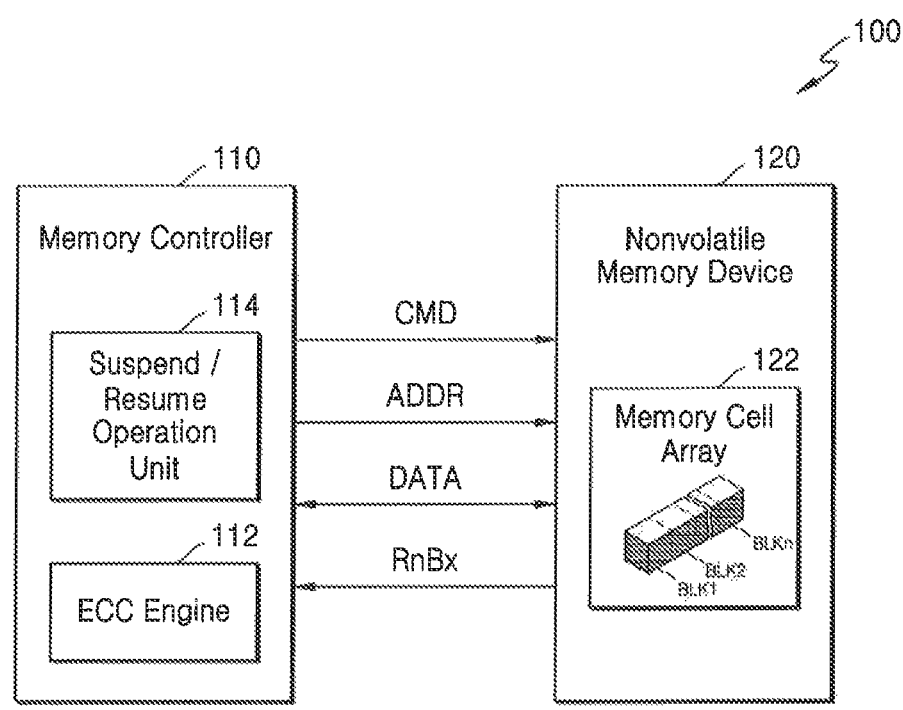
FIG. 1 is a block diagram of a memory system according to an exemplary embodiment of the inventive concept.

FIG. 1 is a block diagram of a memory system 100 according to an exemplary embodiment of the inventive concept.

Referring to FIG. 1, the memory system 100 includes a memory controller 110 and a nonvolatile memory device 120.

The memory controller 110 may control the nonvolatile memory device 120 in response to a request from a host. The memory controller 110 may function as an interface between the host and the nonvolatile memory device 120. The memory controller 110 may write data to the nonvolatile memory device 120 or may read data stored in the nonvolatile memory device 120.

The memory controller 110 may transmit an address ADDR, a program command CMD, and data DATA to the nonvolatile memory device 120, to write data DATA to the nonvolatile memory device 120. To read data DATA stored in the nonvolatile memory device 120, the memory controller 110 may transmit an address ADDR and a read command CMD to the nonvolatile memory device 120.

The nonvolatile memory device 120 may include nonvolatile memory devices such as a NAND flash memory, a NOR flash memory, a phase-change random access memory (PRAM), a resistive random access memory (ROAM), and a magnetoresistive random access memory (MRAM). According to an exemplary the inventive concept, the nonvolatile memory device 120 will be described as a NAND flash memory. For example, the nonvolatile memory device 120 will be described as a charge trap flash memory.

The nonvolatile memory device 120 may operate according to a control of the memory controller 110. For example, the nonvolatile memory device 120 may perform operations such as writing, reading, and erasing of data DATA in response to signals received from the memory controller 110. The nonvolatile memory device 120 includes a memory cell array 122 including memory cells arranged in rows (e.g., between word lines) and columns (e.g., between bit lines).

The memory cell array 122 may include a planar-type NAND string having a single-layer array structure (or a two-dimensional array structure). Additionally, the memory cell array 122 may have a multi-layer array structure (or a three-dimensional (3D) array structure). The 3D memory array includes NAND strings that are arranged vertically so that at least one memory cell is disposed above another memory cell.

The memory cell array 122 may include a plurality of memory blocks BLK1 to BLKn. Each of the plurality of memory blocks BLK1 to BLKn may include a plurality of memory cells and a plurality of selection transistors. The plurality of memory cells may be connected to word lines WL, and the plurality of selection transistors may be connected to string select lines SSL or ground select lines GSL. The memory cells of each of the memory blocks BLK1 to BLKn may include single-level cells that store 1-bit data or multi-level cells that store M-bit data (M is more than 2). The memory cells of each of the memory blocks BLK1 to BLKn may be stacked perpendicularly to a substrate to form a 3D structure. The structure of a memory block will be described in more detail with reference to FIGS. 2 and 3.

For example, the nonvolatile memory device 120 may program or read data in units of pages. A page may refer to memory cells connected to one word line. During a program operation of the nonvolatile memory device 120, one page may be selected and memory cells connected to the selected page may be programmed. The nonvolatile memory device 120 may perform an erase operation in units of blocks. When at least one of the memory blocks BLK1 to BLKn included in the memory cell array 122 is erased, an erase voltage may be applied to the substrate.

The memory controller 110 may include an error correct code (ECC) engine 112 and a suspend/resume operation unit 114. Each of the ECC engine 112 and the suspend/resume operation unit 114 may be a circuit. The ECC engine 112 may generate an ECC with respect to data that is to be stored in the nonvolatile memory device 120. The generated ECC may be stored in a spare region of the nonvolatile memory device 120. The ECC engine 112 may detect and correct an error of data DATA read from the nonvolatile memory device 120 based on the ECC. For example, data DATA read from the nonvolatile memory device 120 may include an ECC.

The suspend/resume operation unit 114 may control a program operation of a selected word line from among a plurality of word lines of the nonvolatile memory device 120, and may suspend the program operation according to an external retrieve request. The suspend/resume operation unit 114 may resume the program operation with respect to the selected word line or a word line different from the selected word line according to a resume time. The resume time may correspond to a time from after the program operation is suspended until the program operation resumes. Additionally, the suspend/resume operation unit 114 may control an erase operation of a selected memory block of the nonvolatile memory device 120, and may suspend the erase operation according to an external retrieve request. The suspend/resume operation unit 114 may resume the erase operation to perform the rest of the erase operation on the selected memory block or restart the erase operation on the selected memory block according to a resume time. The resume time may correspond to a time from after the erase operation is suspended until the erase operation resumes.

Figure 2:
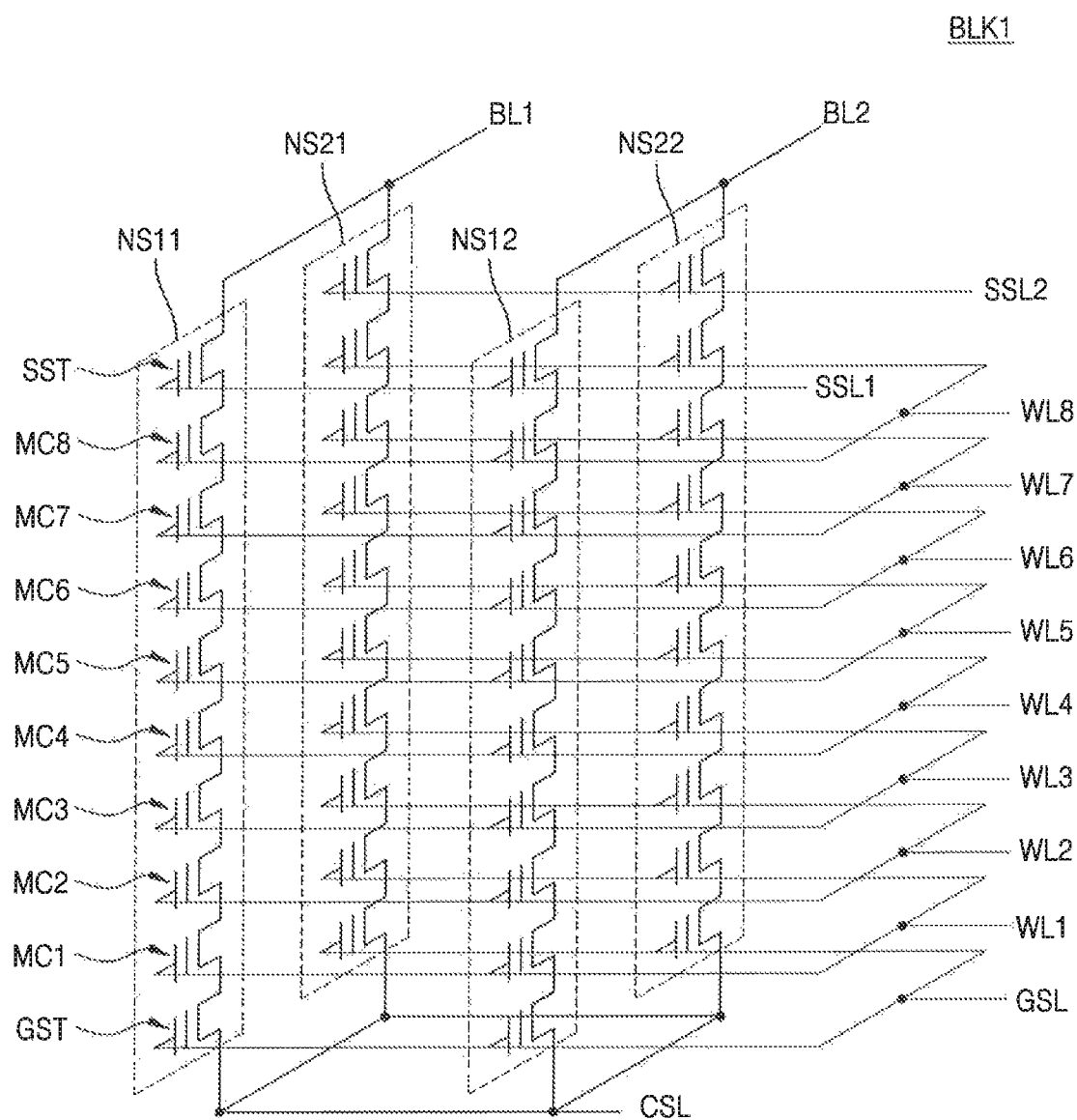
FIG. 2 is a circuit diagram of a memory cell array of FIG. 1, according to an exemplary embodiment of the inventive concept.

FIG. 2 is a circuit diagram the memory cell array 122 of FIG. 1, according to an exemplary embodiment of the inventive concept. Although a portion of a first memory block BLK1 from among the memory blocks BLK1 to BLKn of FIG. 1 will be described with reference to FIG. 2, exemplary embodiments of the inventive concept are not limited thereto. Second to n-th memory blocks BLK2 to BLKn may have the same structure as the first memory block BLK1.

The first memory block BLK1 may include a plurality of NAND strings NS11 to NS22, a plurality of word lines WL1 to WL8, a plurality of bit lines BL including first and second bit lines BL1 and BL2, ground select lines GSL, first and second string select lines SSL1 and SSL2, and a common source line CSL. A string select line SSL may be separated into the first and second select lines SSL1 and SSL2. The number of NAND strings, the number of word lines, the number of bit lines, the number of ground select lines, and the number of string select lines may be variously changed according to exemplary embodiments of the inventive concept.

The NAND strings NS11 and NS21 are provided between the first bit line BL1 and the common source line CSL, and the NAND strings NS12 and NS22 are provided between the second bit line BL2 and the common source line CSL. Each NAND string (for example, the NAND string NS11) may include a string select transistor SST, a plurality of memory cells MC1 to MC8, and a ground select transistor GST that are connected in series.

The string select transistor SST is connected to the first string select line SSL1 or the second string select line SSL2. The plurality of memory cells MC1 to MC8 are respectively connected to the plurality of word lines WL1 to WL8. The ground select transistor GST is connected to the ground select line GSL. The string select transistor SST is connected to the first bit line BL1 or the second bit line BL2, and the ground select transistor GST is connected to the common source line CSL.

Figure 3:
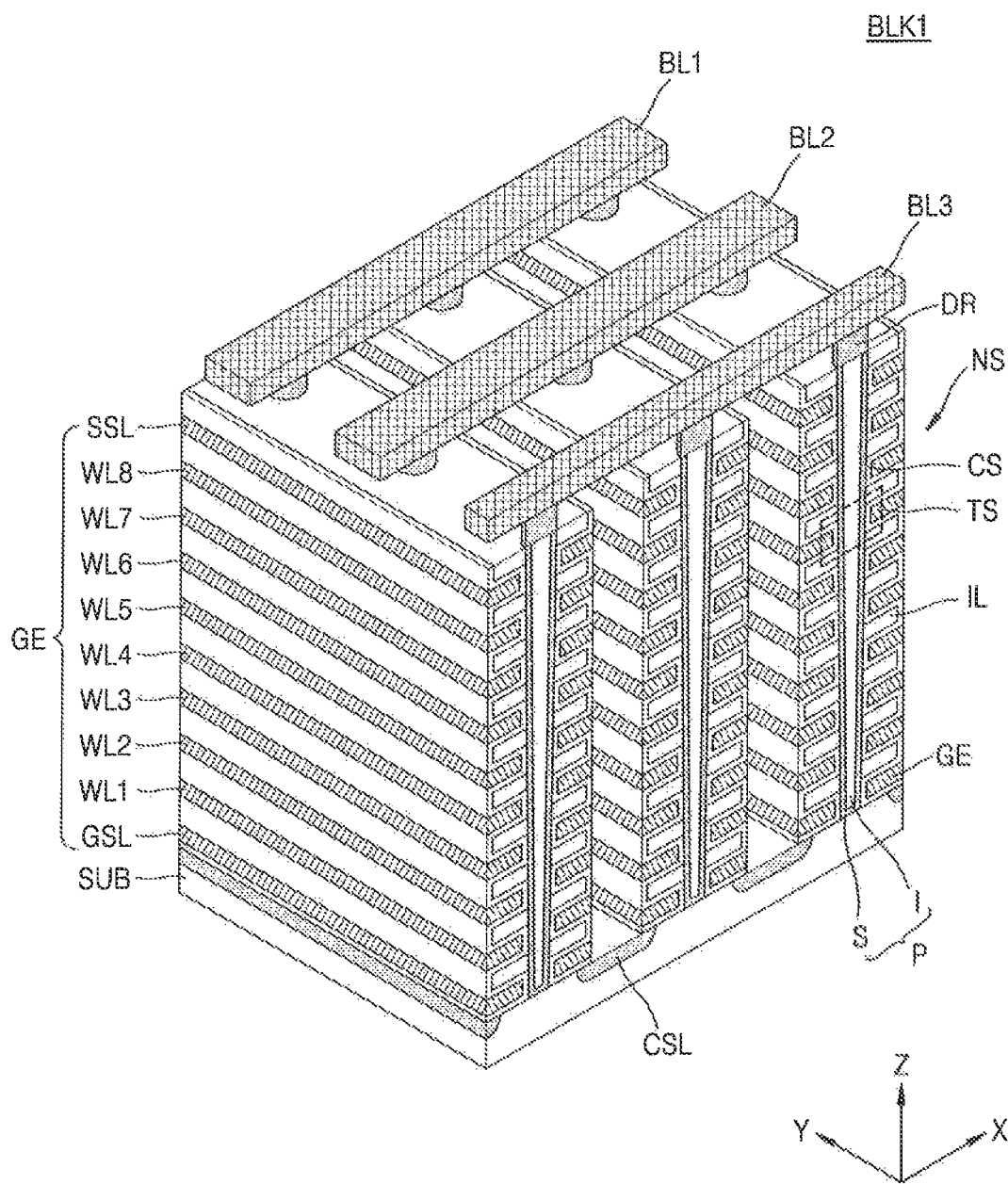
FIG. 3 is a perspective view of a memory block of FIG. 2, according to an exemplary embodiment of the inventive concept.

FIG. 3 is a perspective view of the first memory block BLK1 of FIG. 2, according to an exemplary embodiment of the inventive concept.

Referring to FIG. 3, the first memory block BLK1 is disposed in a direction perpendicular to a substrate SUB. Although the first memory block BLK1 of FIG. 3 includes two select lines, in other words, a ground select line GSL and a string select line SSL, eight word lines WL1 to WL8, and three bit lines BL1 to BL3, the first memory block BLK1 may actually include more or less lines.

The substrate SUB is of a first conductivity type (for example, a p-type). A common source line CSL extending in a first direction (for example, a Y direction) and doped with impurities of a second conductivity type (for example, an n-type) is provided on the substrate SUB. A plurality of insulation layers IL extending in the first direction are sequentially provided in a third direction (for example, a Z direction) over a region of the substrate SUB between two adjacent common source lines CSL. The plurality of insulation layers IL are spaced apart from one another in the third direction by a predetermined distance. For example, the plurality of insulation layers IL may include an insulation material such as silicon oxide.

A plurality of pillars P sequentially disposed in the first direction and passing through the insulation layers IL in the third direction are provided on a region of the substrate SUB between two adjacent common source lines CSL. In a region between two adjacent common source lines CSL, a charge storage layer CS is provided along exposed surfaces of the insulation layers IL, the plurality of pillars P, and the substrate SUB. The charge storage layer CS may include a gate insulation layer (e.g., a 'tunnel insulation layer') a charge trap layer, and a blocking insulation layer.

Drains or drain contacts DR are respectively provided on the pillars P. The bit lines BL1 to BL3 extending in a second direction (for example, an X direction) and spaced apart from one another in the first direction are provided on the drain contacts DR. The pillars P, the insulation layers IL, and the select lines GSL and SSL and the word lines WL1 to WL8 extending in the third direction together form a NAND string NS. The NAND string NS includes a plurality of transistor structures TS. Each of the transistor structures TS may include charge trap flash (CTF) memory cells.

Figure 4:
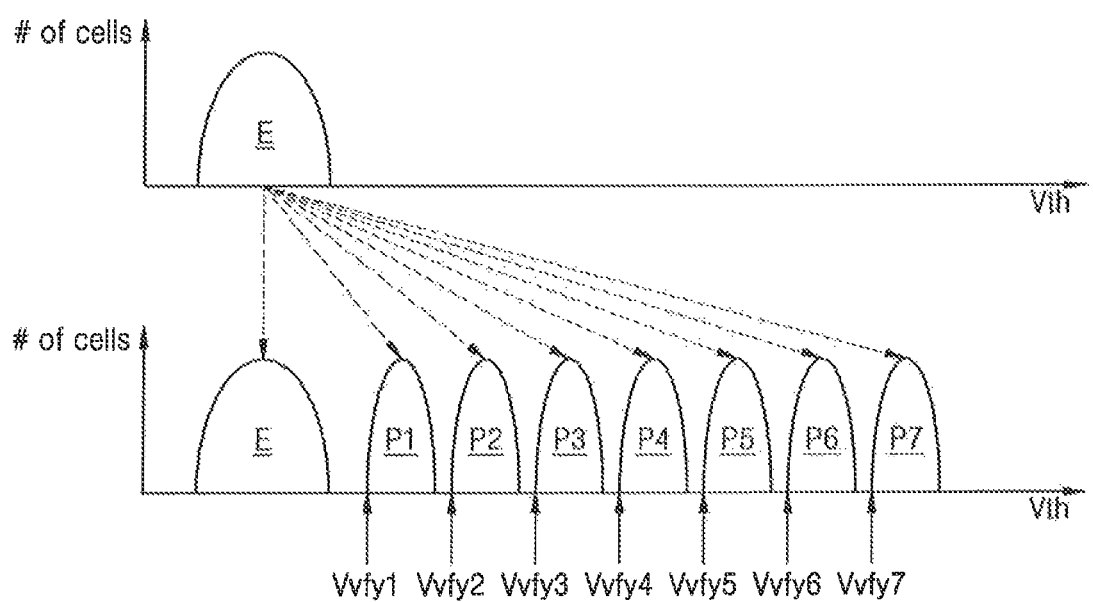
FIG. 4 is a distribution graph illustrating a threshold voltage distribution of memory cells shown in FIG. 3, according to an exemplary embodiment of the inventive concept.
Figure 5:
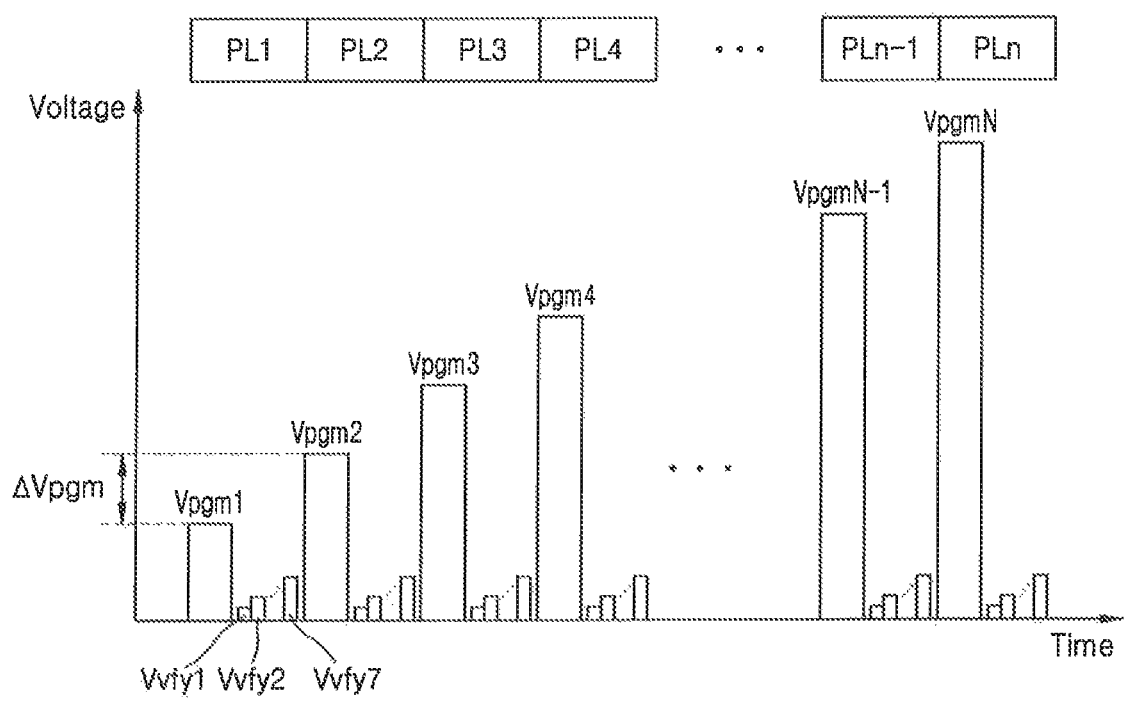
FIG. 5 is a diagram illustrating a program method for forming the threshold voltage distribution of FIG. 4, according to an exemplary embodiment of the inventive concept.

FIG. 4 is a distribution graph illustrating a threshold voltage distribution of memory cells shown in FIG. 3, according to an exemplary embodiment of the inventive concept. FIG. 5 is a diagram illustrating a program method for forming the threshold voltage distribution of FIG. 4, according to an exemplary embodiment of the inventive concept. The description below assumes, for brevity, that each of the memory cells is a 3-bit multi-level cell (e.g., a triple level cell (TLC)). Exemplary embodiments of the inventive concept are not limited thereto, and each of the memory cells may be a 2-bit multi-level cell (MLC) or a multi-level cell that stores 4 bits or more.

Referring to FIG. 4, the horizontal axis denotes a threshold voltage Vth, and the vertical axis denotes the number of memory cells. A plurality of memory cells may have an erase state E. Each of the plurality of memory cells having an erase state may be programmed to have one of the erase state B and first to seventh program states P1 to P7.

For example, as shown in FIG. 5, the nonvolatile memory device 120 (of FIG. 1) may program each of a plurality of memory cells to have one of an erase state E and first to seventh program states P1 to P7 by performing a plurality of program loops PL1 to PLn. Each of the plurality of program loops PL1 to PLn may include a programming step for applying program pulses Vpgm1 to VpgmN and a verifying step for applying verify voltages Vvfy1 to Vvfy7.

For example, when a first program loop PL1 is performed, a first program pulse Vpgm1 may be applied, and then, verify voltages Vvfy1 to Vvfy7 for verifying program states of memory cells may be sequentially applied. Memory cells that are verify-passed by each of the verify voltages Vvfy1 to Vvfy7 may be determined as having a target program state, and may be program-inhibited afterwards in a second program loop PL2. Being verify-passed may refer to a memory cell that has been read as an off-cell by a corresponding verify voltage. A second program pulse Vpgm2 higher than the first program pulse Vpgm1 is applied to program the memory cells other than the memory cells program-inhibited in the second program loop PL2. The second program pulse Vpgm2 is higher than the first program pulse Vpgm1 by a program voltage increase ΔVpgm. After the second program pulse Vpgm2 is applied, a verify operation is performed in the same manner as the verifying step of the first program loop PL1.

As described above, it takes a relatively long time for the nonvolatile memory device 120 to perform an operation of programming a multi-level TLC that stores 3 bits. During the program operation, an access operation for data retrieval may be requested from a host. In this case, for example, the memory controller 110 may suspend the program operation of the nonvolatile memory device 120 by issuing suspend and resume commands and may issue a read command to the nonvolatile memory device 120 to perform a read operation for data retrieval.

Figure 6:
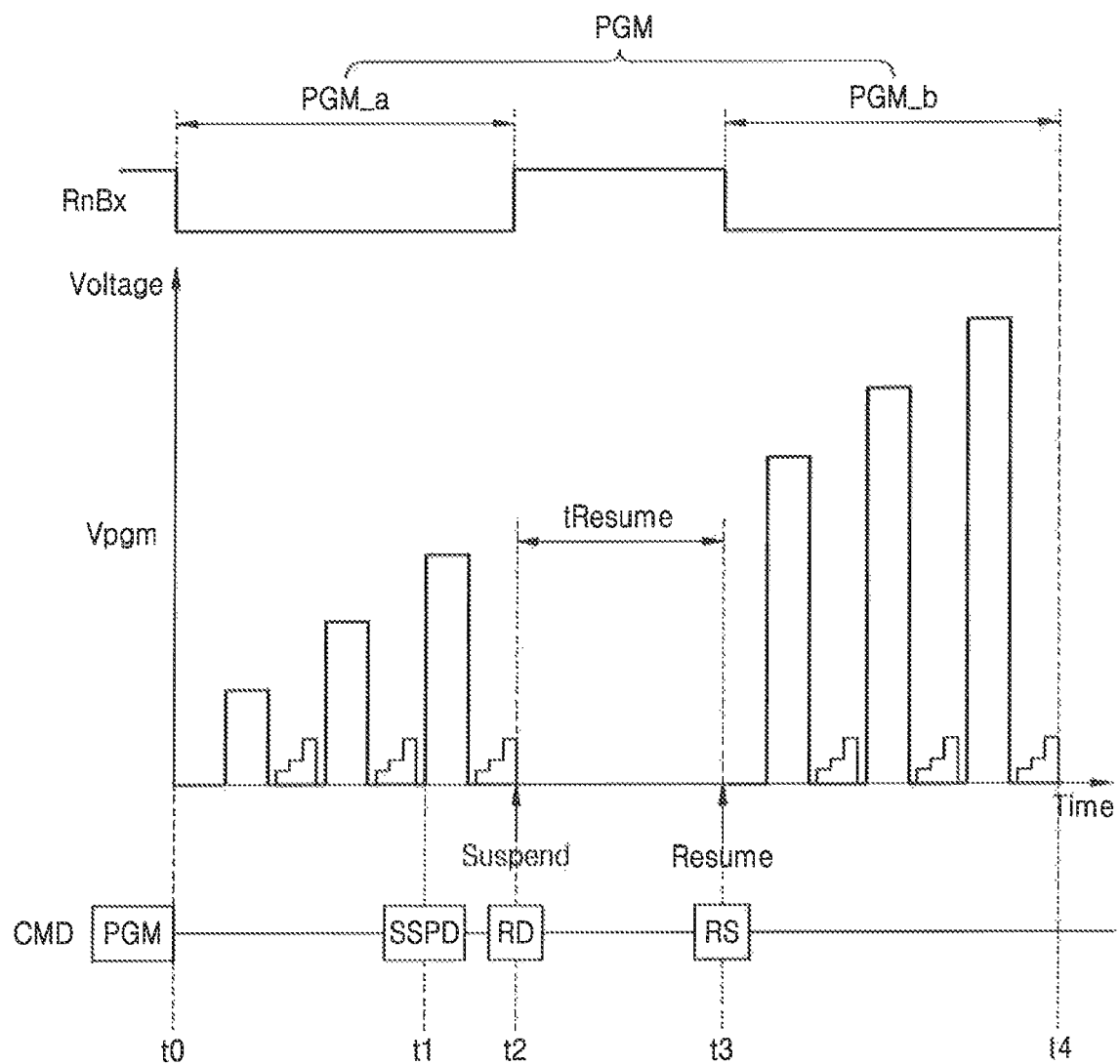
FIG. 6 is a timing diagram of a program operation according to an exemplary embodiment of the inventive concept.
Figure 7:
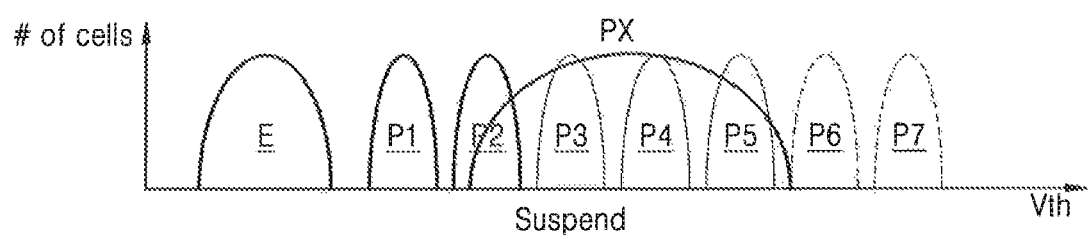
FIGS. 7 and 8 are diagrams of a threshold voltage distribution according to the program operation of FIG. 6, according to an exemplary embodiment of the inventive concept.
Figure 8:
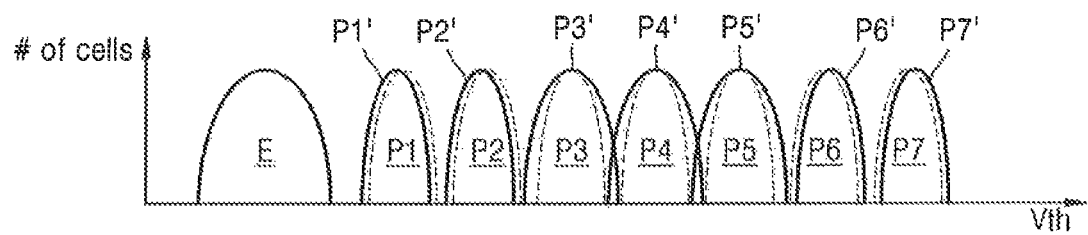

FIG. 6 is a timing diagram of a program operation according to an exemplary embodiment of the inventive concept. FIGS. 7 and 8 are diagrams of a threshold voltage distribution according to the program operation of FIG. 6, according to an exemplary embodiment of the inventive concept. FIG. 7 shows a threshold voltage distribution before a suspend operation, and FIG. 8 shows a threshold voltage distribution after a resume operation.

Referring to FIG. 6 in association with FIG. 1, when a write request from a host arises, the memory controller 110 issues a program command PGM CMD to the nonvolatile memory device 120. The program command PGM CMD may be provided together with an address ADDR of a memory cell to be programmed.

At a time t0, the nonvolatile memory device 120 may output a ready/busy signal RnBx at a low level and provide a notification of a busy state to the outside. For example, the notification may be provided to a device other than the nonvolatile memory device 120. A time period during which the ready/busy signal RnBx is maintained at a low level may correspond to a time it takes for the nonvolatile memory device 120 to perform one portion PGM_a of a program operation. Simultaneously with the output of the ready/busy signal RnBx in a busy state (or while the ready/busy signal RnBx indicates a busy state), the nonvolatile memory device 120 may perform program loops PL for applying a program pulse Vpgm and a verify voltage Vvfy to a word line of a selected memory cell.

During the program operation of the nonvolatile memory device 120, a retrieve request from the host may arise. The memory controller 110 may issue a suspend command SSPD CMD to the nonvolatile memory device 120 at a time t1.

At a time t2, the nonvolatile memory device 120 may perform a suspend operation for temporarily suspending the program operation. In addition, the nonvolatile memory device 120 may change the ready/busy signal RnBx to a high level and provide a notification of a ready state to the outside. In this regard, the memory controller 110 may issue a read command RD CMD to the nonvolatile memory device 120 for data retrieval. The read command RD CMD may be provided together with an address ADDR of a memory cell to be read. The read command RD CMD may be issued at the time t2.

A threshold voltage distribution of memory cells according to the program operation PGM_a that has been performed from the time t0 until the time t2 may correspond to that shown in FIG. 7. For example, when it is assumed in FIG. 7 that each memory cell is programmed to have one of an erase state E, a first program state P1, and a second program state P2 and then suspended, a threshold voltage distribution of memory cells in which third to seventh program states P3 to P7 are target program states may be shown as Px.

Starting from the time t2, the nonvolatile memory device 120 may perform a read operation in response to the read command RD CMD. During the read operation, the memory controller 110 may toggle a read enable signal and receive read data of the nonvolatile memory device 120. When output of the read data is completed, the memory controller 110 may issue a resume command RS CMD to the nonvolatile memory device 120 at a time t3.

In response to the resume command RS CMD, the nonvolatile memory device 120 may change the ready/busy signal RnBx to a low level and provide a notification of a busy state to the outside. In addition, the nonvolatile memory device 120 may perform a resume operation to resume the suspended program operation. The resume operation involves performing another portion PGM_b of the program operation. The program operation may then be completed at a time t4.

The program operation of the nonvolatile memory device 120 may include the first portion PGM_a performed before the suspend operation and the second portion PGM_b performed after the resume operation. As described above, the threshold voltage distribution of memory cells when the first portion PGM_a of the program operation is performed and suspended may correspond to that as shown in FIG. 7. Afterwards, a threshold voltage distribution of memory cells according to the resume operation of the suspended program operation may correspond to that as shown in FIG. 8.

In FIG. 8, each memory cell may be programmed to have one of an erase state E and first to seventh program states P1' to P7'. A threshold distribution of the first to seventh program states P1' to P7' may be changed as compared to first to seventh target program states P1 to P7. There may be various reasons for the change in the threshold voltage distribution.

For example, memory cells programmed according to the first portion PGM_a of the program operation before the suspend operation may have a threshold voltage distribution such as that of the first and second program states P1' and P2'. The threshold distribution of the first and second program states P1' and P2' may be shifted to the left compared to that of the first and second target program states P1 and P2. This is due to charge loss from a lapse of program time, for example.

Threshold distribution ranges of the third to fifth program states P3' to P5' may be widened in both directions compared to those of the third to fifth target program states P3 to P5. This may be due to a memory cell coupled to an adjacent memory cell. For example, threshold voltages of memory cells of an n-th word line WLn may be shifted when an upper page is programmed to memory cells of an adjacent (n+1)th word line. The reason for the widening (or broadening) of the threshold voltage distribution is that, when an upper page is programmed to the memory cells of the (n+1)th word line, the memory cells of the n-th word line WLn are subjected to word line coupling.

A threshold distribution of the sixth and seventh program states P6' and P7' may be shifted to the right compared to that of the sixth and seventh target program states P6 and P7. This is due to the influence of programming using a reprogramming method, for example. During the program operation, the nonvolatile memory device 120 may again perform main-programming of data to a main region. The main-programmed data may be buffer-programmed to a buffer region of the memory cell array 122. For example, to program a plurality of pages, main-programming may be implemented using a reprogramming method including three steps. The number of target distributions of memory cells formed by each of the three steps of the reprogram operation is the same. For example, when memory cells are 3-bit triple level cells, the memory cells may be programmed to have 8 threshold voltage distributions in each reprogram step.

The transformation of the threshold voltage distribution of memory cells (P1' to P7') described above may cause the program operation to fail. In addition, as a program time according to a resume time tResume from after the program operation is suspended (t2) until the program operation resumes (t3) lengthens, a degree of the transformation of the threshold voltage distribution of the memory cells (P1' to P7') increases. Thus, degradation of program reliability may occur. If, however, the memory controller 110 may control a resume operation of the program operation by taking into account the resume time tResume from after the program operation of the nonvolatile memory device 120 is suspended until the program operation resumes, program reliability may increase.

Figure 9:
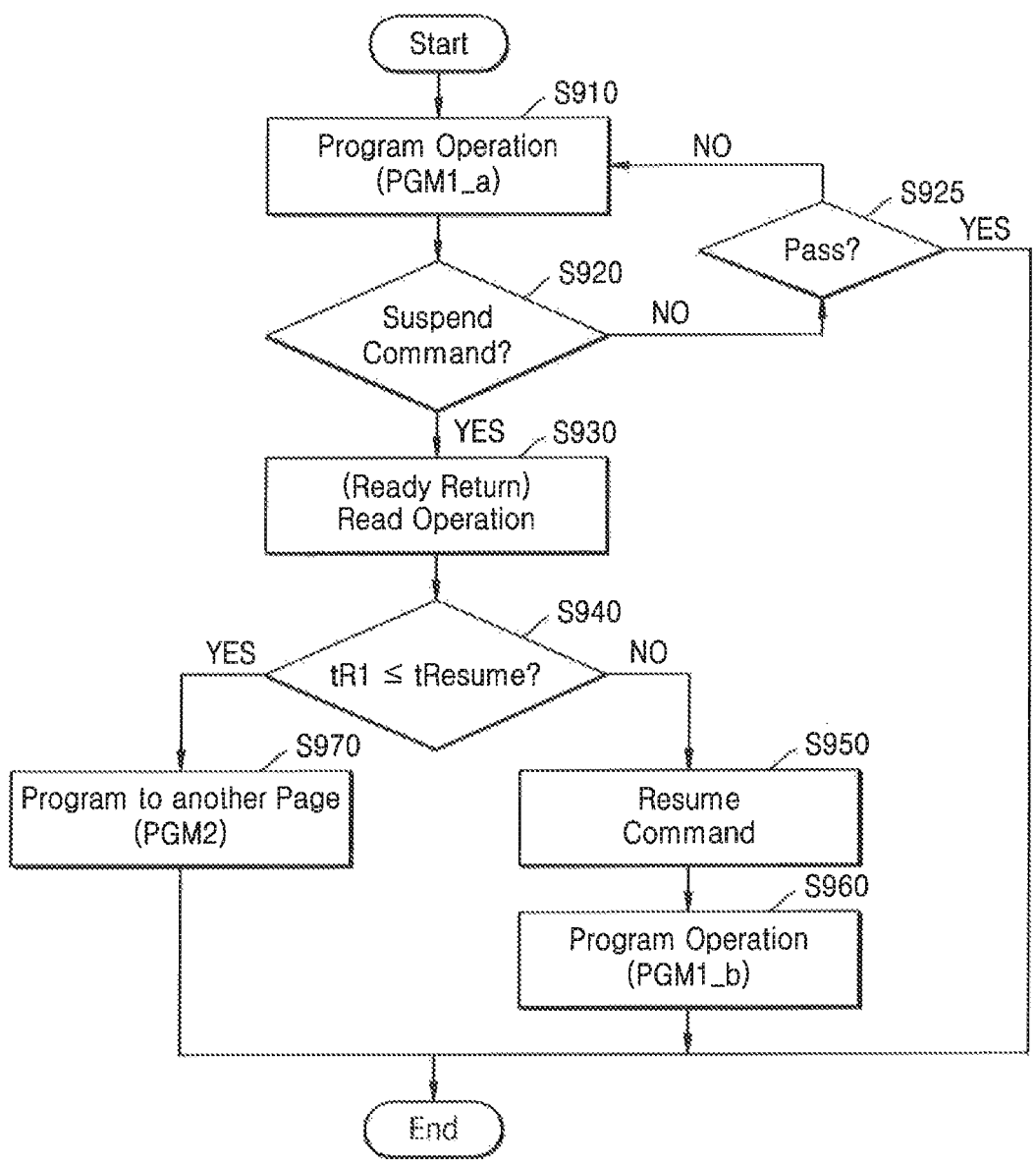
FIG. 9 is a flowchart of a program operation of a nonvolatile memory device, according to an exemplary embodiment of the inventive concept.

FIG. 9 is a flowchart of a program operation of a nonvolatile memory device, according to an exemplary embodiment of the inventive concept.

Referring to FIG. 9 in association with FIGS. 1 and 6, in operation S910, the nonvolatile memory device 120 may perform a first program operation PGM1_a for applying a program pulse Vpgm and verify voltages Vvfy to a selected word line. The first program operation PGM1_a may be a portion of a program operation PGM1. A program operation of the nonvolatile memory device 120 may be performed in units of pages. The nonvolatile memory device 120 may program memory cells connected to a selected page by applying a program pulse Vpgm and a verify voltage Vvfy to the selected page.

In operation S920, the memory controller 110 may receive a retrieve request from a host during the program operation of the nonvolatile memory device 120. In this case, the memory controller 110 may issue a suspend command SSPD CMD to the nonvolatile memory device 120. If there is no retrieve request, the procedure moves on to operation S925.

In operation S925, the nonvolatile memory device 120 may determine whether all program loops have been performed to pass the program operation. When the program operation is passed, the nonvolatile memory device 120 terminates the first program operation PGM1_a. When the program operation is not passed, the nonvolatile memory device 120 may return to operation S910, and may perform again a program operation for applying the program pulse Vpgm and the verify voltage Vvfy to the selected page and verifying whether the memory cells connected to the selected page have been programmed. As operation S910 is performed again, the program pulse Vpgm may gradually increase. Moreover, if operation S910 is performed for a third time and so forth, the program pulse Vpgm may gradually increase.

When the suspend command SSPD CMD is issued from the memory controller 110 to the nonvolatile memory device 120 (operation S920), in operation S930, the nonvolatile memory device 120 may perform a suspend operation to temporarily suspend the first program operation PGM1_a. In addition, the nonvolatile memory device 120 may provide a notification of a ready state to the outside by outputting a ready/busy signal RnBx at a high level. In this regard, the memory controller 110 may issue a read command RD CMD together with an address ADDR of a memory cell to be read to the nonvolatile memory device 120 for data retrieval. The nonvolatile memory device 120 may perform a read operation in response to the read command RD CMD.

When the read operation of the nonvolatile memory device 120 terminates, in operation S940, the memory controller 110 may detect a resume time tResume from after the first program operation PGM1_a is suspended until the first program operation PGM1_a resumes. In addition, the memory controller 110 may determine whether the resume time tResume is as long as a reference time tR1. The reference time tR1 may be a time that may secure program reliability even though a threshold voltage distribution of the suspended first program operation PGM1_a is transformed during the suspending operation (e.g., during the read operation). When the resume time tResume is not greater than the reference time tR1, the procedure moves on to operation S950. On the other hand, when the resume time tResume is equal to or greater than the reference time tR1, the procedure moves on to operation S970.

In operation S950, the memory controller 110 may issue a resume command RS CMD to the nonvolatile memory device 120.

In operation S960, the nonvolatile memory device 120 may provide a notification of a busy state to the outside by outputting the ready/busy signal RnBx at a low level in response to the resume command RS CMD and may resume the suspended first program operation PGM1_a. Following the suspended program operation, the nonvolatile memory device 120 may apply the program pulse Vpgm and the verify voltage Vvfy to the selected page and verify whether the memory cells connected to the selected page have been programmed. In other words, the nonvolatile memory device 120 may perform a remaining portion PGM1_b of the program operation PGM1 and complete the program operation PGM1.

In this regard, a final program loop that belongs to the first program operation PGM1_a may include a program step of the corresponding program loop, and a first program loop that belongs to the remaining portion PGM1_b of the program operation PGM1 may include a verify step of the corresponding program loop. In exemplary embodiments of the inventive concept, a final program loop that belongs to the first program operation PGM1_a may include a verify step of the corresponding program loop, and a first program loop that belongs to the remaining portion PGM1_b of the program operation PGM1 may include a program step of the next program loop. In exemplary embodiments of the inventive concept, a final program loop that belongs to the first program operation PGM1_a may include a verify step of the corresponding program loop, and a first program loop that belongs to the remaining portion PGM1_b of the program operation PGM1 may include a verify step of the corresponding program loop.

In operation S970, since the resume time tResume is equal to or greater than the reference time tR1, the memory controller 110 may not acknowledge program reliability with respect to the threshold voltage distribution of the suspended first program operation PGM1_a of the nonvolatile memory device 120. Accordingly, the memory controller 110 may ignore the suspended first program operation PGM1_a of the selected page and may perform another program operation PGM2 for another page. The program operation PGM1 may be referred to as a first program operation and the program operation PGM2 may be referred to as a second program operation.

In an alternative embodiment of the inventive concept, the first program operation may not be the actual first program operation of an ongoing program operation. For example, it may correspond to a program operation that occurs after a suspended program operation.

For example, the memory controller 110 may transmit a program command including a new address ADDR to the nonvolatile memory device 120. The nonvolatile memory device 120 may select another page based on the received new address ADDR and may perform the program operation PGM2 to apply a program pulse Vpgm and a verify voltage Vvfy to the other page.

Figure 10:
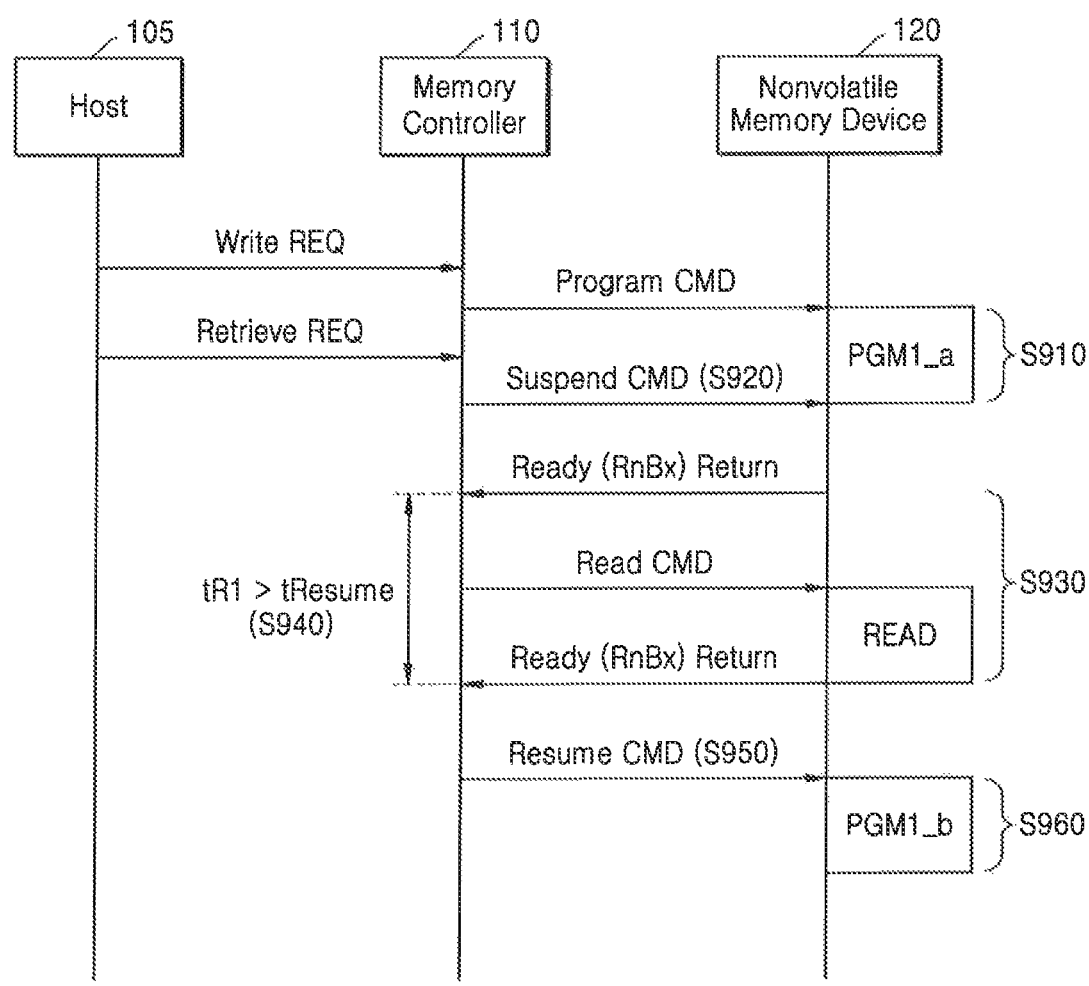
FIGS. 10 and 11 are diagrams for describing a program method of FIG. 9, according to an exemplary embodiment of the inventive concept.
Figure 11:
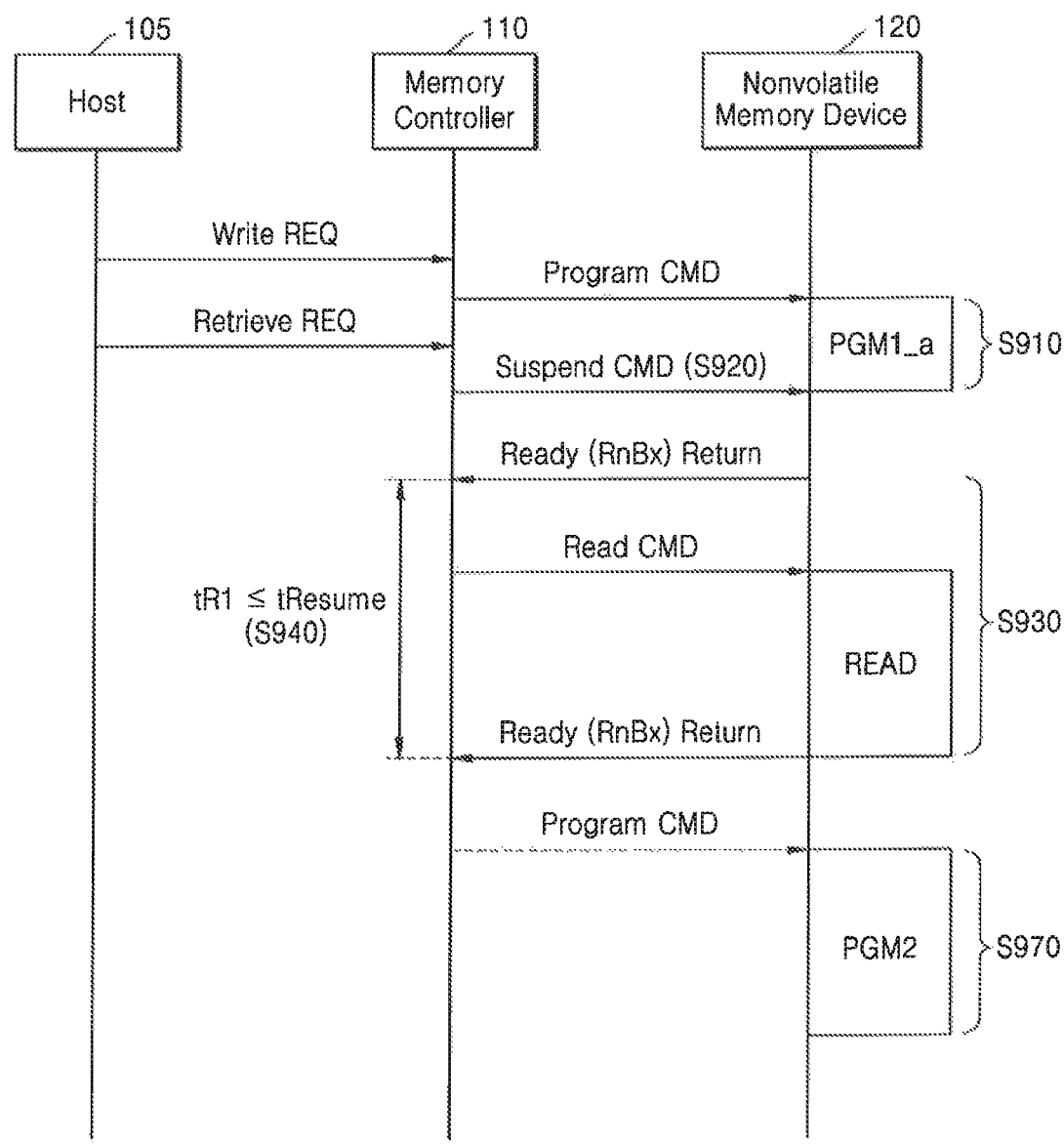

FIGS. 10 and 11 are diagrams for describing a program method of FIG. 9, according to an exemplary embodiment of the inventive concept.

Referring to FIGS. 9 and 10, in operation S910, the memory controller 110 may, according to a write request from a host 105, issue a program command to the nonvolatile memory device 120, and the nonvolatile memory device 120 may perform a first program operation PGM1_a for one page in response to the program command. In operation S920, the memory controller 110 may receive a retrieve request from the host 105 during the first program operation PGM1_a, and may issue a suspend command to the nonvolatile memory device 120.

The nonvolatile memory device 120 may, in response to the suspend command, perform a suspend operation to temporarily suspend the first program operation PGM1_a, and may output a ready/busy signal RnBx in a ready state to the memory controller 110. The memory controller 110 may issue a read command to the nonvolatile memory device 120 for data retrieval, in operation S930, the nonvolatile memory device 120 may perform a read operation in response to the read command, and when the read operation terminates, the nonvolatile memory device 120 may output the ready/busy signal RnBx in a ready state to the memory controller 110.

In operation S940, the memory controller 110 may determine whether a resume time tResume from after the first program operation PGM1_a is suspended until the first program operation PGM1_a resumes has elapsed as much as a reference time tR1. In operation S950, when the resume time tResume is not greater than the reference time tR1, the memory controller 110 may issue a resume command RS CMD to the nonvolatile memory device 120. In operation S960, following the suspended first program operation PGM1_a, the nonvolatile memory device 120 may perform a remaining portion PGM1_b of the program operation PGM1 for the same selected page, in response to the resume command RS CMD.

Referring to FIGS. 9 and 11, as compared with FIG. 10, there is additionally shown a succeeding operation (operation S970) after the determining operation (operation S940) of the resume time tResume. Since other operations are the same as those shown in FIG. 10 they may not be described with reference to FIG. 11.

In FIG. 11, when the resume time tResume is equal to or greater than the reference time tR1 in operation S940, the suspended first program operation PGM1_a may be ignored, and the program operation PGM2 for another page of the nonvolatile memory device 120 may be performed in operation S970.

It has been described in the above embodiment of FIGS. 9 to 11 that the memory controller 110 may control a nonvolatile memory device according to whether a resume time tResume has elapsed as much as a reference time tR1 for program reliability. When the resume time tResume is not greater than the reference time tR1, the memory controller 110 may resume a suspended first program operation. When the resume time tResume is equal to or greater than the reference time tR1, the memory controller 110 may ignore the suspended first program operation and may instruct a new second program operation to be performed.

Figure 12:
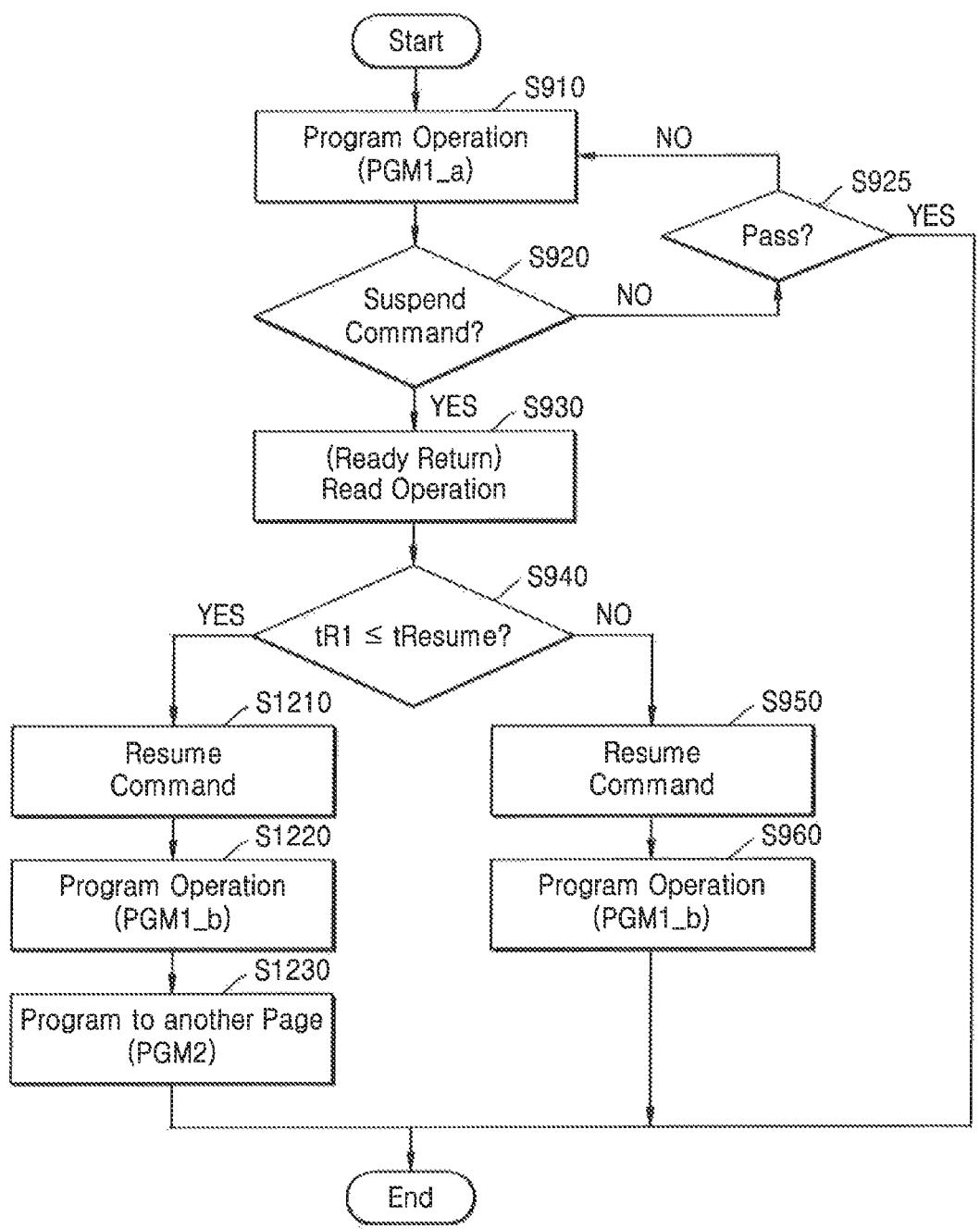
FIGS. 12 and 13 are diagrams of a program method of a nonvolatile memory device, according to an exemplary embodiment of the inventive concept.
Figure 13:
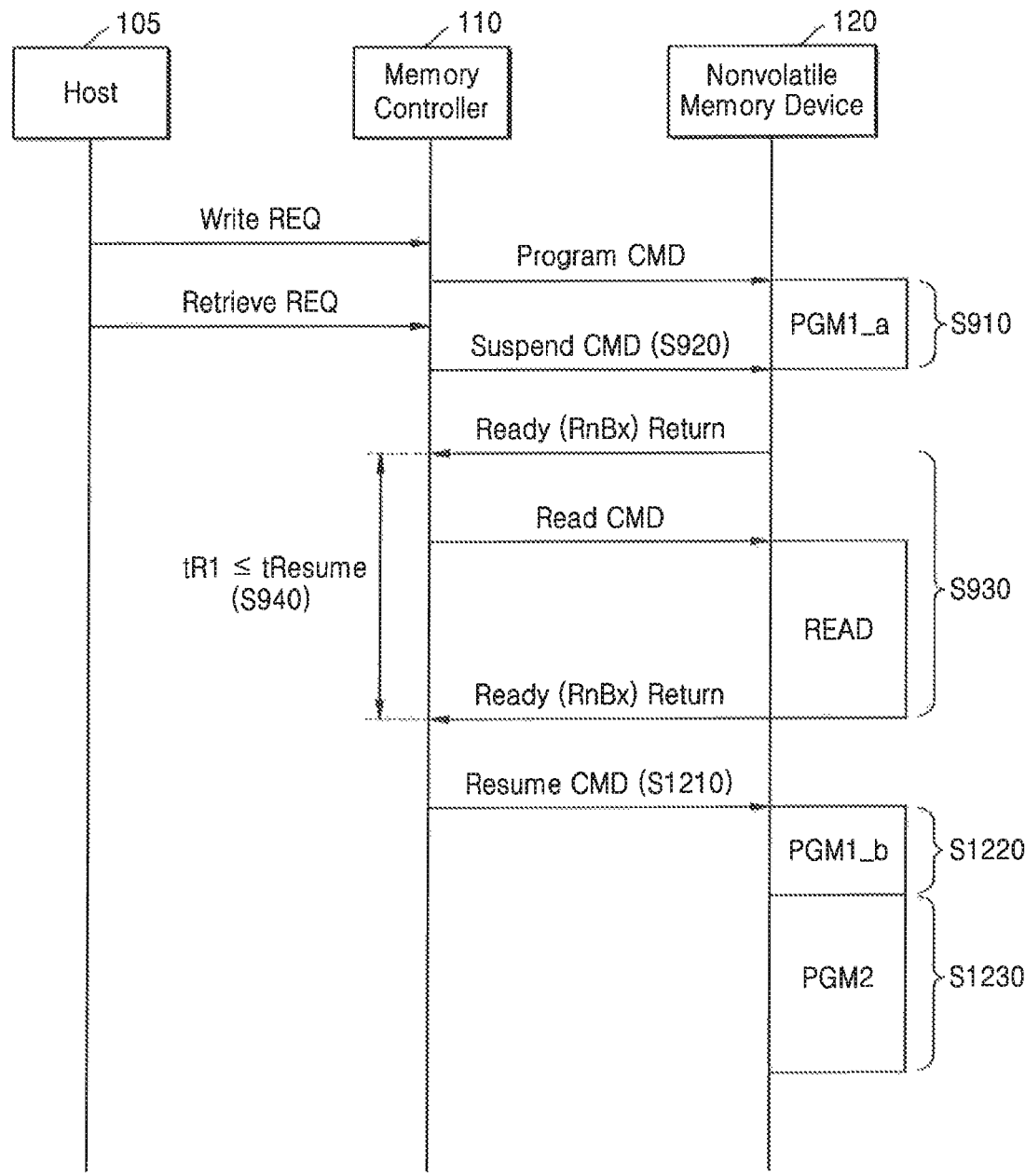

FIGS. 12 and 13 are diagrams of a program method of a nonvolatile memory device, according to an exemplary embodiment of the inventive concept.

Referring to FIGS. 12 and 13, the program method includes additional steps with respect to the program method of FIG. 9. In particular, FIGS. 12 and 13 show succeeding operations that may occur when the resume time tResume is equal to or greater than the reference time tR1 in operation S940. Since the other operations are the same as those shown in FIG. 9 they may not be described with reference to FIGS. 12 and 13.

When the resume time tResume is determined to be equal to or greater than the reference time tR1 in operation S940, the memory controller 110 may issue a resume command RS CMD to the nonvolatile memory device 120 in operation S1210. In operation S1220, in response to the resume command RS CMD, following a suspended first program operation PGM1_a, the nonvolatile memory device 120 may apply a program pulse Vpgm and a verify voltage Vvfy to a selected page and perform a remaining portion PGM1_b of the program operation PGM1 of the selected page.

In operation S1230, the memory controller 110 may complete the program operation PGM1 for the selected page and may perform the program operation PGM2 for another page. For example, the memory controller 110 may transmit a program command including a new address ADDR to the nonvolatile memory device 120. The nonvolatile memory device 120 may select another page based on the received new address ADDR and may perform the program operation PGM2 for applying a program pulse Vpgm and a verify voltage Vvfy to the other page.

In the embodiment of FIGS. 12 and 13 described above, when the resume time tResume is equal to or greater than the reference time tR1, the memory controller 110 may resume and complete a suspended first program operation (PGM1), and then, may instruct a new second program operation (PGM2) to be performed.

Figure 14:
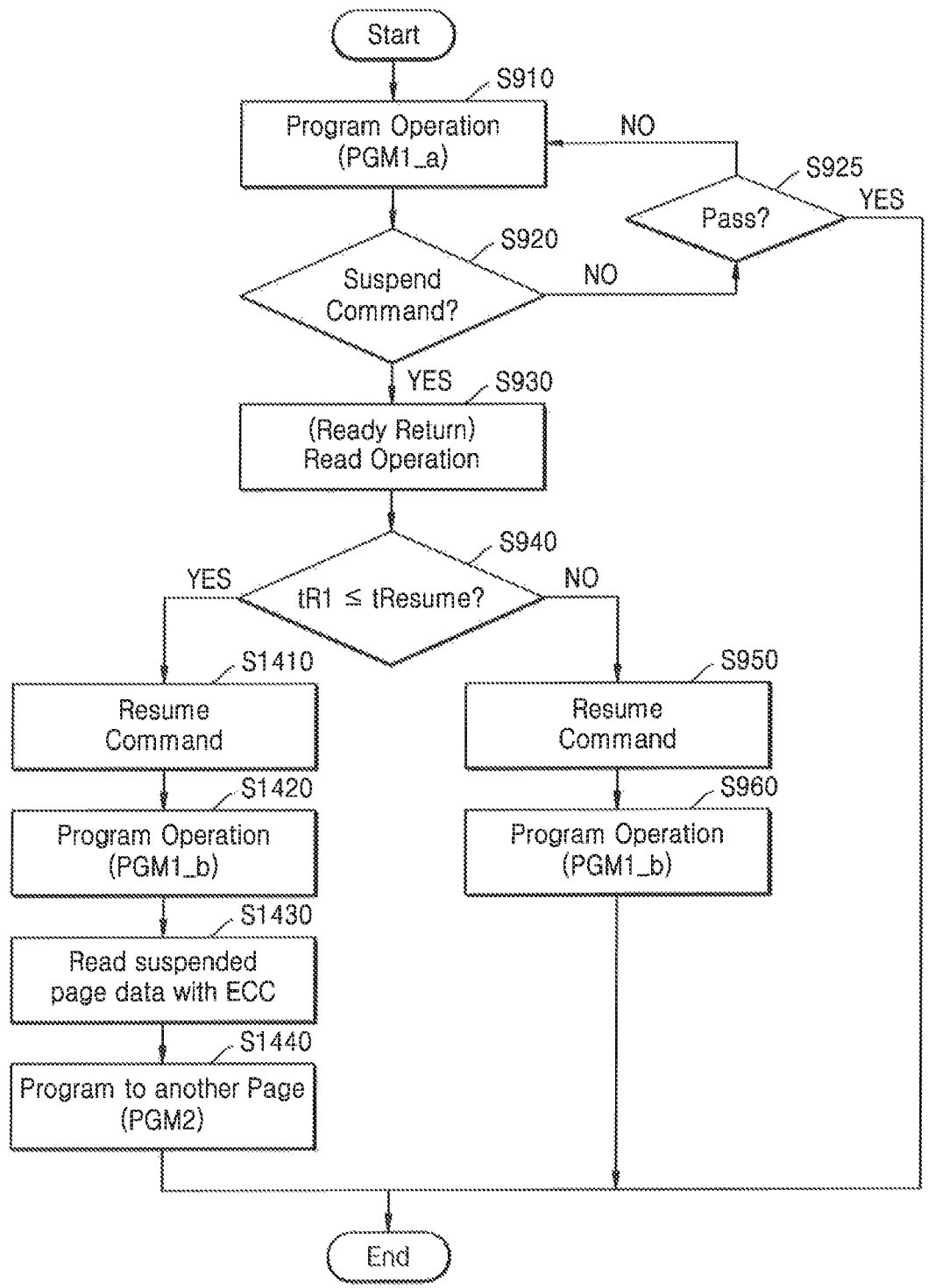
FIGS. 14 and 15 are diagrams of a program method of a nonvolatile memory device, according to an exemplary embodiment of the inventive concept.
Figure 15:
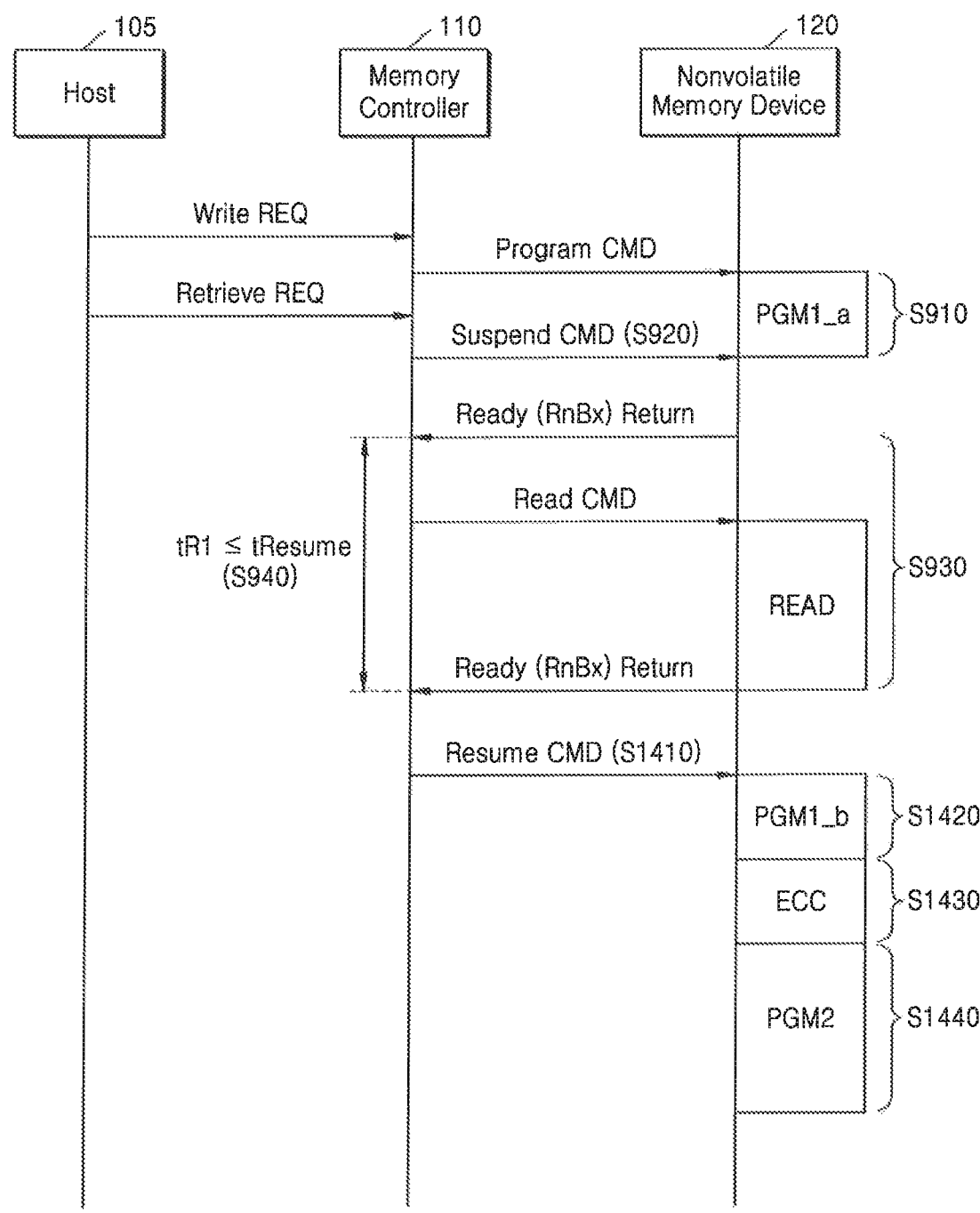

FIGS. 14 and 15 are diagrams of a program method of a nonvolatile memory device, according to an exemplary embodiment of the inventive concept.

Referring to FIGS. 14 and 15, the program method includes additional steps with respect to the program method of FIG. 9. In particular, FIGS. 14 and 15 show succeeding operations that may occur when the resume time tResume is equal to or greater than the reference time tR1 in operation S940. Since other operations are the same as those shown in FIG. 9 they may not be described with reference to FIGS. 14 and 15.

When the resume time tResume is determined as equal to or greater than the reference time tR1 in operation S940, the memory controller 110 may issue a resume command RS CMD to the nonvolatile memory device 120 in operation S1410. In operation S1420, in response to the resume command RS CMD, the nonvolatile memory device 120 may provide a notification of a busy state to the outside by outputting a ready/busy signal RnBx at a low level and may resume a remaining portion PGM1_b of a first program operation PGM1. In other words, following the suspended portion PGM1_a of the first program operation PGM1, the nonvolatile memory device 120 may apply a program pulse Vpgm and a verify voltage Vvfy to a selected page and perform the remaining portion PGM1_b of the first program operation PGM1 for verifying whether memory cells connected to the selected page have been programmed.

In operation S1430, the memory controller 110 may perform a read operation with respect to the selected page suspended in a first program operation PGM1 and resumed. For example, the memory controller 110 may issue a read command RD CMD together with an address ADDR of the selected page to the nonvolatile memory device 120, and may detect and correct an error with respect to data DATA read from the nonvolatile memory device 120 by using the ECC engine 112 (of FIG. 1).

In operation S1440, the memory controller 110 may complete the ECC regarding the first program operation PGM1 of the selected page (in operation S1430) and may perform a second program operation PGM2 regarding another page. For example, the memory controller 110 may transmit a program command including a new address ADDR to the nonvolatile memory device 120. The nonvolatile memory device 120 may select another page based on the received new address ADDR and may perform a second program operation PGM2 to apply a program pulse Vpgm and a verify voltage Vvfy to the other page.

In the embodiment of FIGS. 14 and 15, when the resume time tResume is equal to or greater than the reference time tR1, the memory controller 110 may resume and complete a suspended first program operation, may perform ECC for the suspended first program operation, and then, may control a new second program operation to be performed.

Figure 16:
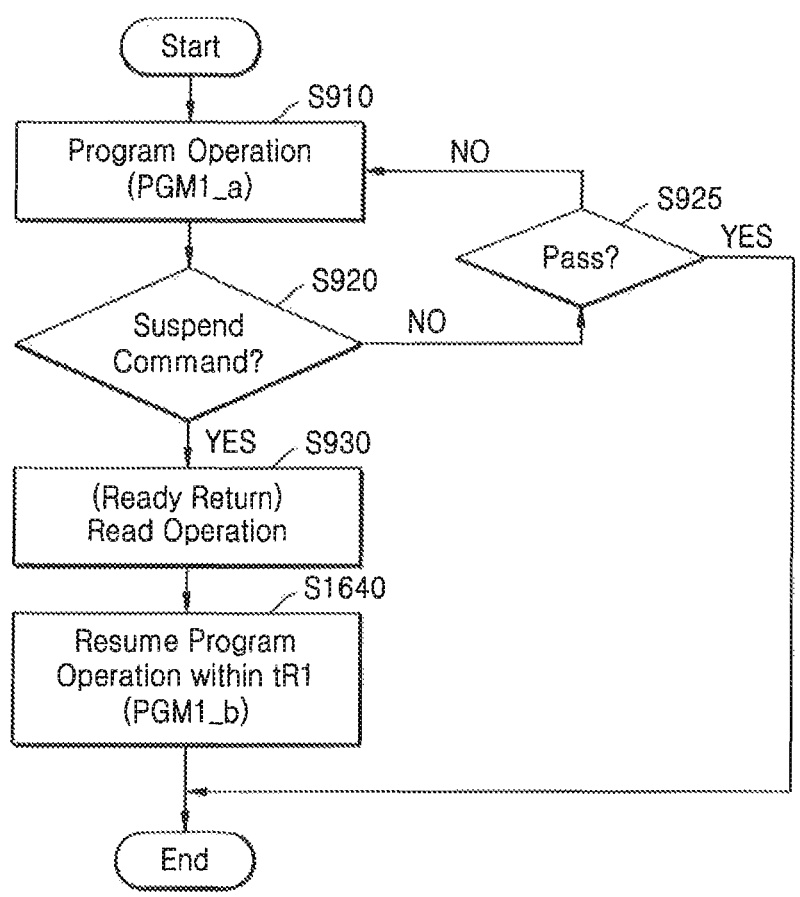
FIG. 16 is a flowchart of a program operation of a nonvolatile memory device, according to an exemplary embodiment of the inventive concept.

FIG. 16 is a flowchart of a program operation of a nonvolatile memory device, according to an exemplary embodiment of the inventive concept.

Referring to FIG. 16 in association with FIGS. 1 and 6, a program method of FIG. 16 includes other steps than the program method of FIG. 9. Since other operations are the same as those shown in FIG. 9, they may not be described with reference to FIG. 16.

After operations S910 to S930 described with reference to FIG. 9 are performed, the memory controller 110 may, in operation S1640 resume a suspended program operation of the nonvolatile memory device 120 within a reference time tR1 for program reliability. Accordingly, following the suspended program operation, the nonvolatile memory device 120 may apply a program pulse Vpgm and a verify voltage Vvfy to a selected page and perform a remaining portion PGM_b of a program operation of memory cells connected to the selected page, and may complete the program operation.

In the embodiment of FIG. 16, the memory controller 110 may resume a program operation suspended within the reference time tR1 and complete the program operation.

Figure 17:
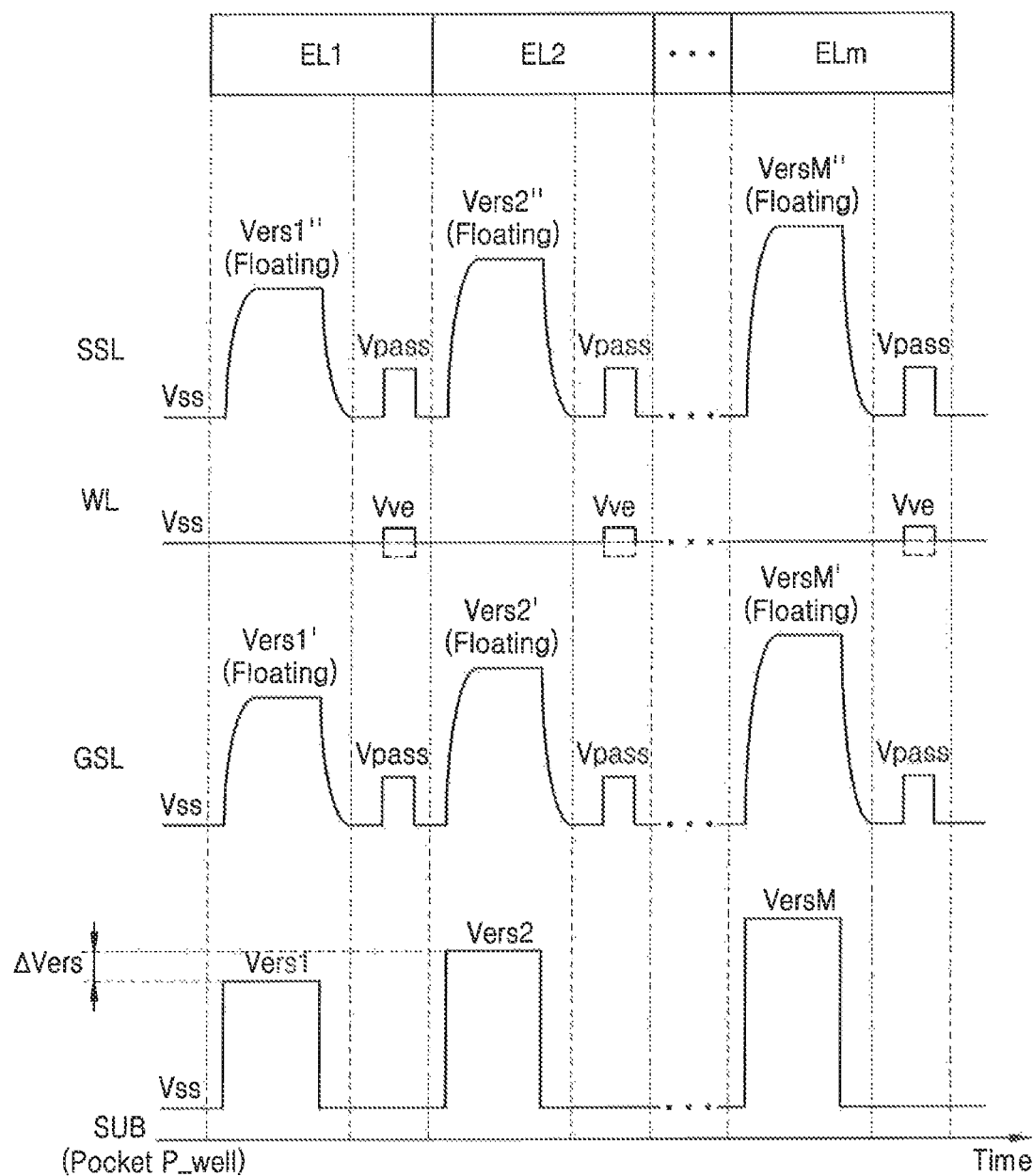
FIGS. 17, 18 and 19 are diagrams of an erase operation of a nonvolatile memory device of FIG. 1, according to an exemplary embodiment of the inventive concept.
Figure 18:
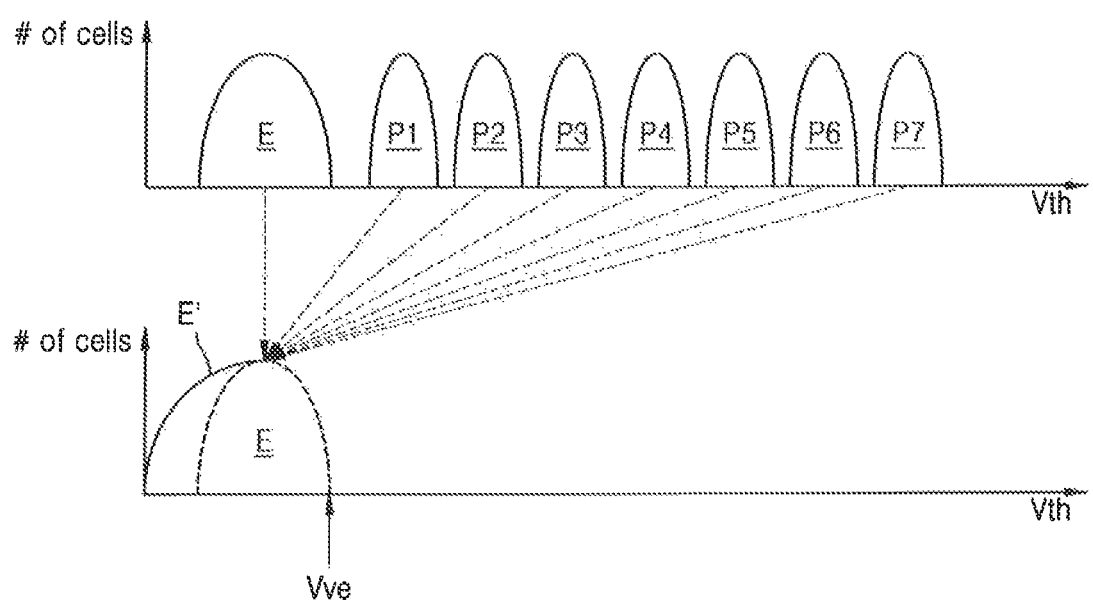
Figure 19:
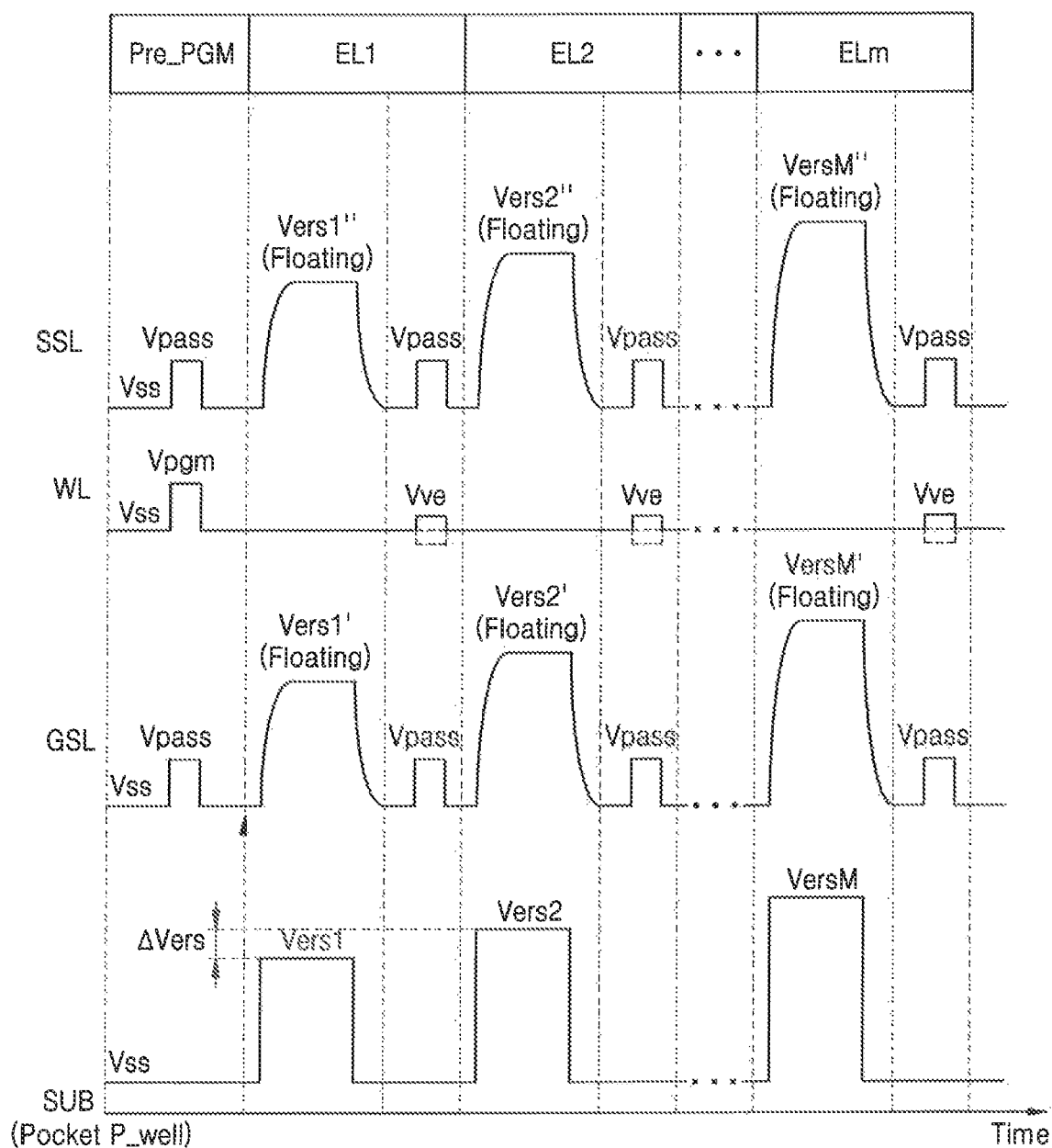

FIGS. 17 to 19 are diagrams of an erase operation of the nonvolatile memory device 120 of FIG. 1, according to an exemplary embodiment of the inventive concept. FIGS. 17 and 19 are timing diagrams of levels of voltages that are applied to the substrate SUB together with the string select line SSL, the word lines WL, and the ground select line GSL described with reference to the circuit diagram of FIG. 2. FIG. 18 is a distribution graph of a threshold voltage distribution of a plurality of memory cells. In FIGS. 17 and 19, the X-axis denotes time and the Y-axis denotes a voltage level. In FIG. 18, the X-axis denotes a threshold voltage, and the Y-axis denotes the number of memory cells.

Referring to FIGS. 17 and 18, each of memory cells of the first memory block BLK1 may have one of an erase state E and first to seventh program states P1 to P7, and may form the threshold voltage distribution shown in FIG. 18.

The nonvolatile memory device 120 may perform a plurality of erase loops EL1 to ELm so that the memory cells of the first memory block BLK1 may have the erase state E. For example, the nonvolatile memory device 120 may erase the first memory block BLK1 based on an incremental step pulse erase (ISPE) method.

For example, the nonvolatile memory device 120 may erase the first memory block BLK1 by performing a plurality of erase loops EL1 to ELm. Each of the plurality of erase loops EL1 to ELm may include an erase step for applying an erase voltage Vers1~Versm to the substrate SUB and an erase verify step for verifying an erase state of the first memory block BLK1 by using an erase verify voltage Vve. Since the substrate SUB corresponds to a pocket P_well of the first memory block BLK1, the substrate SUB will be hereinafter referred to as a pocket P_well SUB of the first memory block BLK1.

For example, in an erase step of a first erase loop EL1, a first erase pulse Vers1 is applied to a pocket P_well SUB of the first memory block BLK1, a ground select line GSL and a string select line SSL are floated, and a ground voltage Vss is applied to a word line WL. Due to coupling influence between first erase pulses Vers1 supplied to the pocket P_well SUB of the first memory block BLK1, voltage levels of the ground select line GSL and the string select line SSL may respectively ascend to levels of Vers1' and Vers1". Afterwards, the first erase pulse Vers1 supplied to the pocket P_well SUB of the first memory block BLK1 descends to the ground voltage Vss. In the erase step of the first erase loop EL1, a threshold voltage of memory cells of the first memory block BLK1 may be decreased by the first erase pulse Vers1.

Afterwards, in an erase verify step of the first erase loop EL1, an erase verify voltage Vve is applied to a plurality of word lines WL, and a pass voltage Vpass is applied to the ground select line GSL and the string select line SSL. For example, the erase verify voltage Vve may be a positive (+) voltage, the ground voltage Vss, or a negative (−) voltage. The erase verify voltage Vve may be an upper limit value of a threshold voltage distribution in an erase state. The pass voltage Vpass may be a high voltage capable of turning off a ground select transistor (GST) and a string select transistor (SST).

In the erase verify step of the first erase loop EL1, the memory cells that have a threshold voltage higher than the erase verify voltage Vve may be turned off. When the memory cells that are turned off are detected by the erase verify voltage Vve, the first memory block BLK1 is determined as not having been erased (e.g., an erase fail). When all the memory cells are turned on by the erase verify voltage Vve, the first memory block BLK1 is determined as having been erased (e.g., erase-passed).

In the case of an erase fail, the nonvolatile memory device 120 performs a second erase loop EL2. In an erase step of the second erase loop EL2, a second erase pulse Vers2 is applied to the pocket P_well SUB of the first memory block BLK1, the ground select line GSL and the string select line SSL are floated, and the ground voltage Vss is applied to the word line WL. For example, the second erase pulse Vers2 may be a voltage higher than the first erase pulse Vers1 by an erase voltage increase ΔVers. Due to the second erase pulse Vers2 supplied to the pocket P_well SUB of the first memory block BLK1, voltage levels of the ground select line GSL and the string select line SSL may respectively ascend to levels of Vers2' and Vers2". Afterwards, the second erase pulse Vers2 supplied to the pocket P_well SUB of the first memory block BLK1 descends to the ground voltage Vss. An erase verify step of the second erase loop EL2 may be performed in the same manner as the erase verify step of the first erase loop EL1.

When the first memory block BLK1, voltage is erase-passed by a plurality of erase loops EL performed as described above, memory cells of the first memory block BLK1 may have a target erase state E.

However, due to physical characteristics of memory cells and a memory block, locations of the memory cells and the memory block, etc., the memory cells of the erased first memory block BLK1 may have a threshold voltage distribution of an erase state E', as shown in FIG. 18. Compared to the target erase state E, the erase state E' may have a wider distribution range and a smaller lower limit value. The erase state E' may be referred to as a "deep erase". When the deep erase occurs, a program operation time may increase during a subsequent program operation, and data retention capacity may decrease after being programmed.

To gather an erase distribution of the first memory block BLK1, a pre-program erase method shown in FIG. 19 may be used.

In FIG. 19, the nonvolatile memory device 120 may perform a pre-program operation Pre_PGM ahead of performing a plurality of erase loops EL1 to ELm. The pre-program operation Pre_PGM involves applying a program voltage Vpgm to word lines WL and applying a pass voltage Vpass to a ground select line GSL and a string select line SSL. A threshold voltage of memory cells of the first memory block BLK1 may be increased by as much as a predetermined level by the pre-program operation Pre_PGM.

The plurality of erase loops EL1 to ELm, which are performed after the pre-program operation Pre_PGM, are the same as those in the erase method described with reference to FIG. 17. When a pre-program erase method including the pre-program operation Pre_PGM is performed, memory cells of the first memory block BLK1 may have a threshold voltage distribution of the erase state E as shown in FIG. 18. In other words, when a memory block is erased according to the pre-program erase method, an erase distribution may improve.

Figure 20:
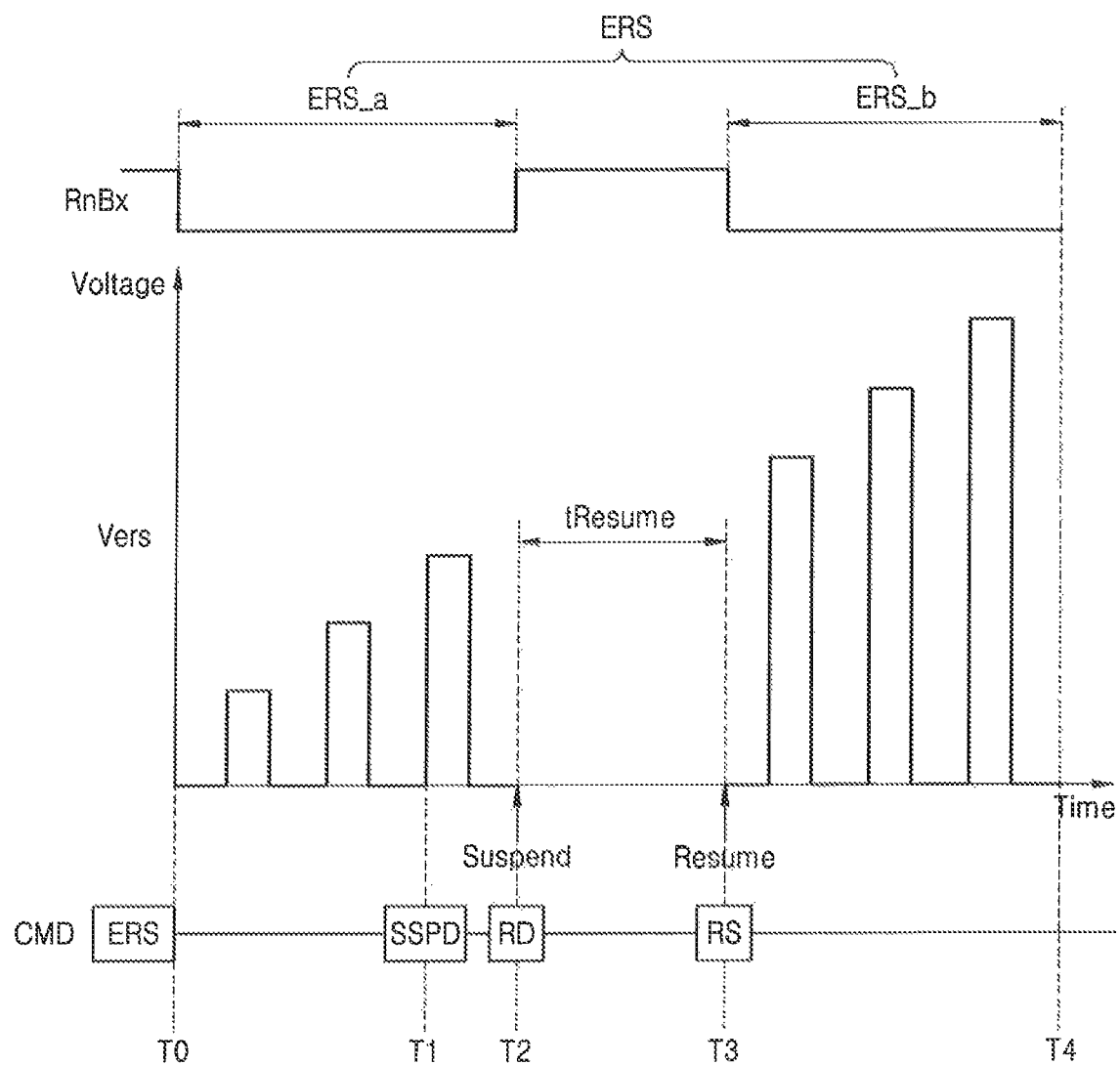
FIG. 20 is a timing diagram of an erase operation according to an exemplary embodiment of the inventive concept.

FIG. 20 is a timing diagram of an erase operation according to an exemplary embodiment of the inventive concept.

Referring to FIG. 20, when an erase request from a host arises, the memory controller 110 issues an erase command ERS CMD to the nonvolatile memory device 120. The erase command ERS CMD may be provided together with an address ADDR of a memory block to be erased.

At a time T0, the nonvolatile memory device 120 may output a ready/busy signal RnBx at a low level and provide a notification of a busy state to the outside. A time period during which the ready/busy signal RnBx is maintained at a low level corresponds to the nonvolatile memory device 120 performing one portion ERS_a of an erase operation. Simultaneously with the output of the ready/busy signal RnBx in a busy state, the nonvolatile memory device 120 may perform erase loops EL for applying an erase pulse Vers to a pocket P_well of a memory block to be erased and applying a verify voltage Vve to a plurality of word lines WL.

During the erase operation of the nonvolatile memory device 120, a retrieve request from the host may arise. The memory controller 110 may issue a suspend command SSPD CMD to the nonvolatile memory device 120 at a time T1.

At a time T2, the nonvolatile memory device 120 may perform a suspend operation to temporarily suspend the erase operation. In addition, the nonvolatile memory device 120 may change the ready/busy signal RnBx to a high level and provide a notification of a ready state to the outside. In this regard, the memory controller 110 may issue a read command RD CMD to the nonvolatile memory device 120 for data retrieval. The read command RD CMD may be provided together with an address ADDR of a memory cell to be read.

Starting from the time T2, the nonvolatile memory device 120 may perform a read operation in response to the read command RD CMD. During the read operation, the memory controller 110 may toggle a read enable signal and receive read data of the nonvolatile memory device 120. When output of the read data is completed, the memory controller 110 may issue a resume command RS CMD to the nonvolatile memory device 120 at a time T3.

In response to the resume command RS CMD, the nonvolatile memory device 120 may change the ready/busy signal RnBx to a low level and provide a notification of a busy state to the outside. In addition, the nonvolatile memory device 120 may perform a resume operation for resuming the suspended erase operation. The resume operation involves performing the other portion ERS_b of the erase operation, and the erase operation may be completed at a time T4.

Figure 21:
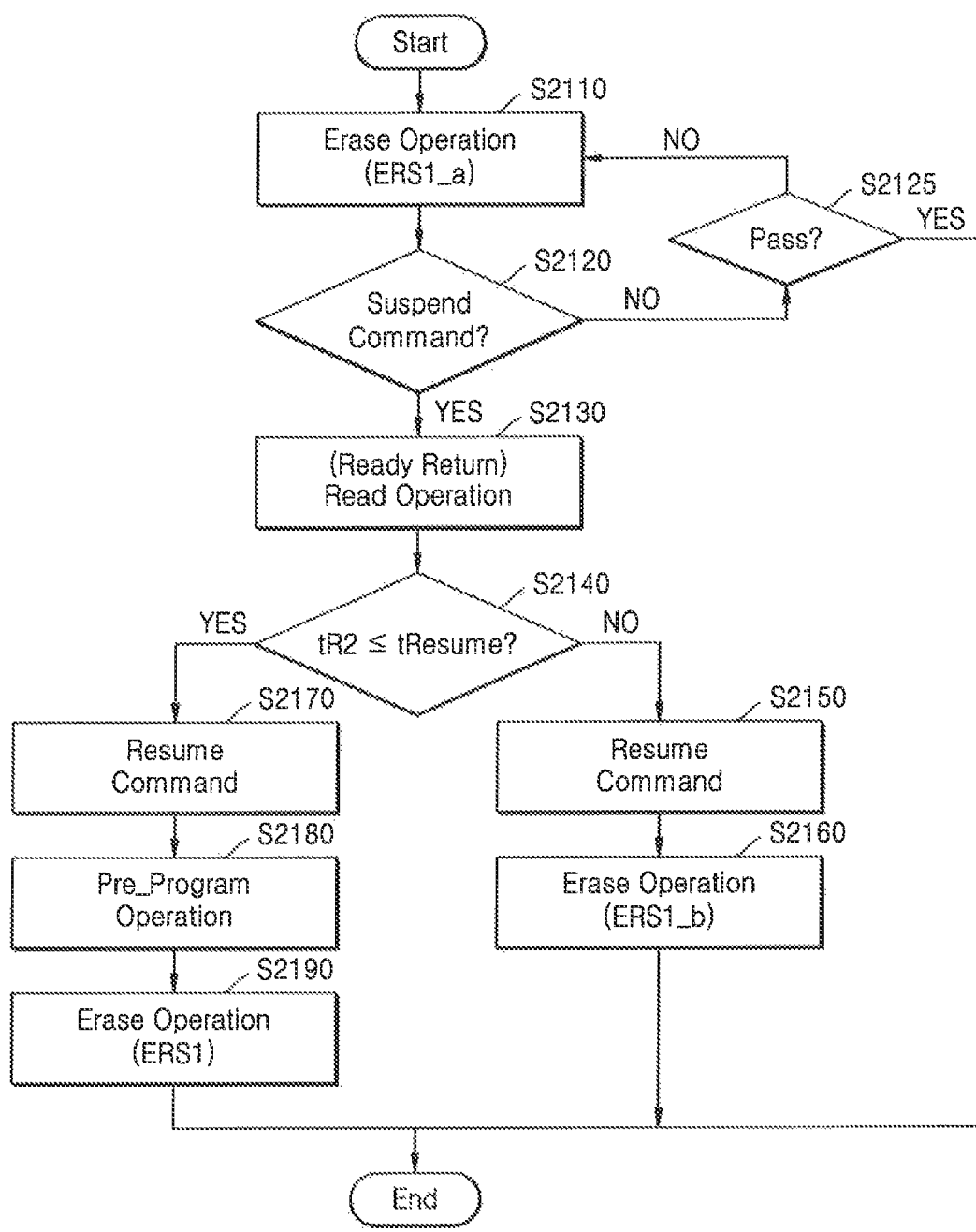
FIG. 21 is a flowchart of an erase operation of a nonvolatile memory device, according to an exemplary embodiment of the inventive concept.

FIG. 21 is a flowchart of an erase operation of a nonvolatile memory device, according to an exemplary embodiment of the inventive concept.

Referring to FIG. 21 in association with FIGS. 1 and 20, in operation S2110, the nonvolatile memory device 120 may perform an erase operation ERS1_a for applying an erase pulse Vers and verify voltages Vve to a substrate. The erase operation ERS1_a of the nonvolatile memory device 120 may be performed in units of blocks. The nonvolatile memory device 120 may verify whether memory cells of the first memory block BLK1 have been erased by applying an erase pulse Vers and an erase verify voltage Vve to the first memory block BLK1.

In operation S2120, the memory controller 110 may receive a retrieve request from a host during the erase operation of the nonvolatile memory device 120, and may issue a suspend command to the nonvolatile memory device 120. If there is no retrieve request, the procedure moves on to operation S2125.

In operation S2125, the nonvolatile memory device 120 may determine whether an erase operation for the first memory block BLK1 has been passed. When the erase operation is passed, the nonvolatile memory device 120 terminates the erase operation. When the erase operation is not passed, the nonvolatile memory device 120 may return to operation S2110, and may again perform an erase operation ERS1_a for applying the erase pulse Vers and the verify voltage Vve to the first memory block BLK1 and verifying whether memory cells of the first memory block BLK1 have been erased. As operation S2110 is again performed, the erase pulse Vers may gradually increase. Moreover, if operation S2110 is performed for a third time and so forth, the erase pulse Vers may gradually increase.

When the suspend command is issued from the memory controller 110 to the nonvolatile memory device 120 (operation S2120), in operation S2130, the nonvolatile memory device 120 may perform a suspend operation to temporarily suspend an erase operation ERS1_a. In addition, in operation S2130, the nonvolatile memory device 120 may provide a notification of a ready state to the outside by outputting a ready/busy signal RnBx at a high level. In this regard, the memory controller 110 may issue a read command RD CMD together with an address ADDR of a memory cell to be read to the nonvolatile memory device 120 for data retrieval. The nonvolatile memory device 120 may perform a read operation in response to the read command RD CMD.

Afterwards, when the read operation of the nonvolatile memory device 120 terminates, in operation S2140, the memory controller 110 may detect a resume time tResume from after the erase operation is suspended until the erase operation resumes. In addition, the memory controller 110 may determine whether the resume time tResume has elapsed as much as a reference time tR2. The reference time tR2 may be a time that may secure erase reliability even though a threshold voltage distribution of the suspended erase operation ERS1_a is transformed during the suspending operation (e.g., during the read operation). When the resume time tResume is not greater than the reference time tR2, the procedure moves on to operation S2150. On the other hand, when the resume time tResume is equal to or greater than the reference time tR2, the procedure moves on to operation S2170.

In operation S2150, the memory controller 110 may issue a resume command RS CMD to the nonvolatile memory device 120.

In operation S2160, the nonvolatile memory device 120 may provide a notification of a busy state to the outside by outputting the ready/busy signal RnBx at a low level in response to the resume command RS CMD, and may resume the suspended erase operation. Following the suspended erase operation ERS1_a, the nonvolatile memory device 120 may apply the erase pulse Vers and the verify voltage Vve to the first memory block BLK1 and verify whether memory cells of the first memory block BLK1 have been erased. In other words, the nonvolatile memory device 120 may perform a remaining portion ERS1_b of the erase operation and complete the erase operation.

In operation S2170, since the resume time tResume is equal to or greater than the reference time tR2, the memory controller 110 may not acknowledge erase reliability with respect to a threshold voltage distribution of the suspended erase operation ERS1_a of the nonvolatile memory device 120. Accordingly, the memory controller 110 may ignore the suspended erase operation ERS1_a for the first memory block BLK1 and may again perform the erase operation for the first memory block BLK1. For this, the memory controller 110 may issue a resume command RS CMD to the nonvolatile memory device 120.

In operation S2180, the nonvolatile memory device 120 may perform a pre-program operation Pre_PGM on the first memory block BLK1 in response to the resume command RS CMD. A threshold voltage of memory cells of the first memory block BLK1 may be increased by as much as a predetermined level by the pre-program operation Pre_PGM. In operation S2190, after the pre-program operation Pre_PGM, the nonvolatile memory device 120 may complete an erase operation ERS1 for the first memory block BLK1 by performing a plurality of erase loops EL1 to ELm.

Figure 22:
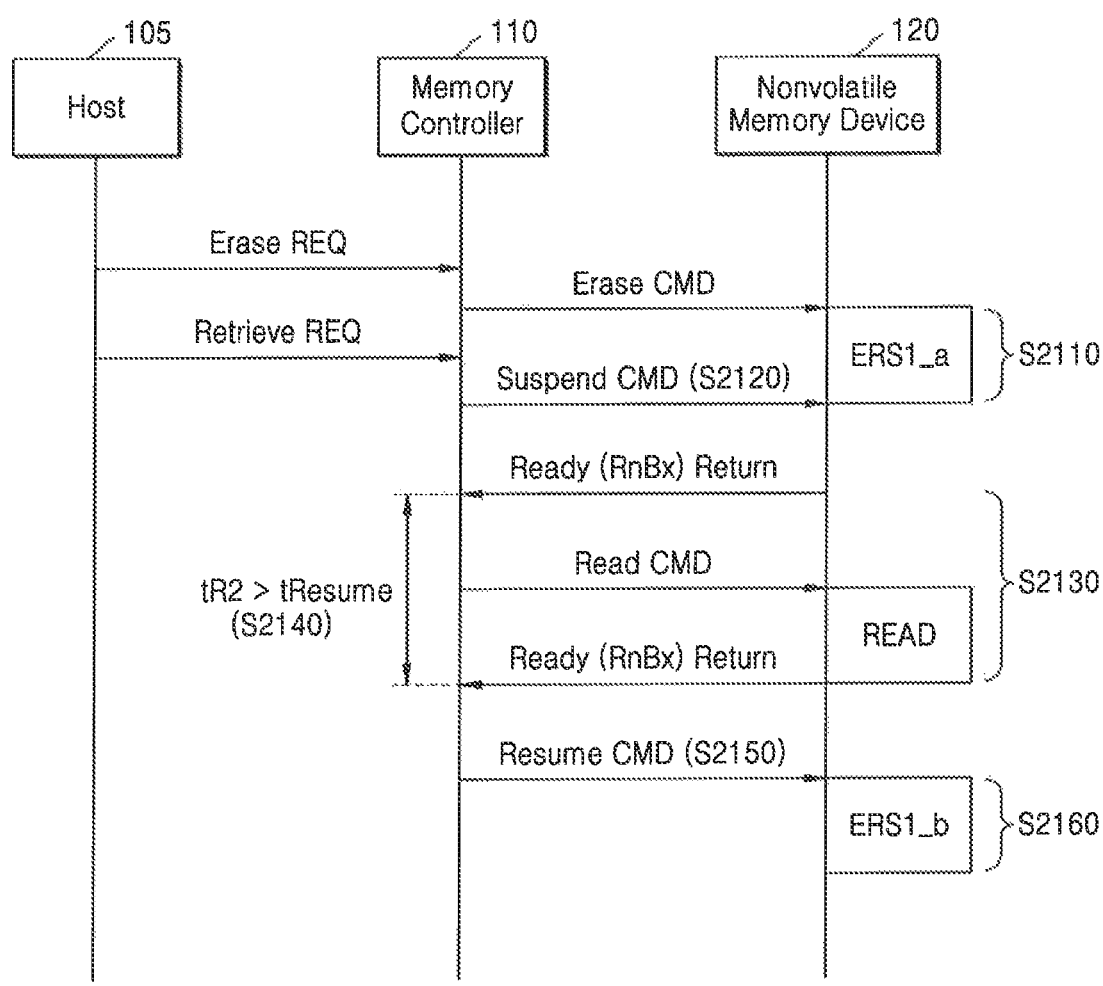
FIGS. 22 and 23 are diagrams for describing an erase method of FIG. 21, according to an exemplary embodiment of the inventive concept.
Figure 23:
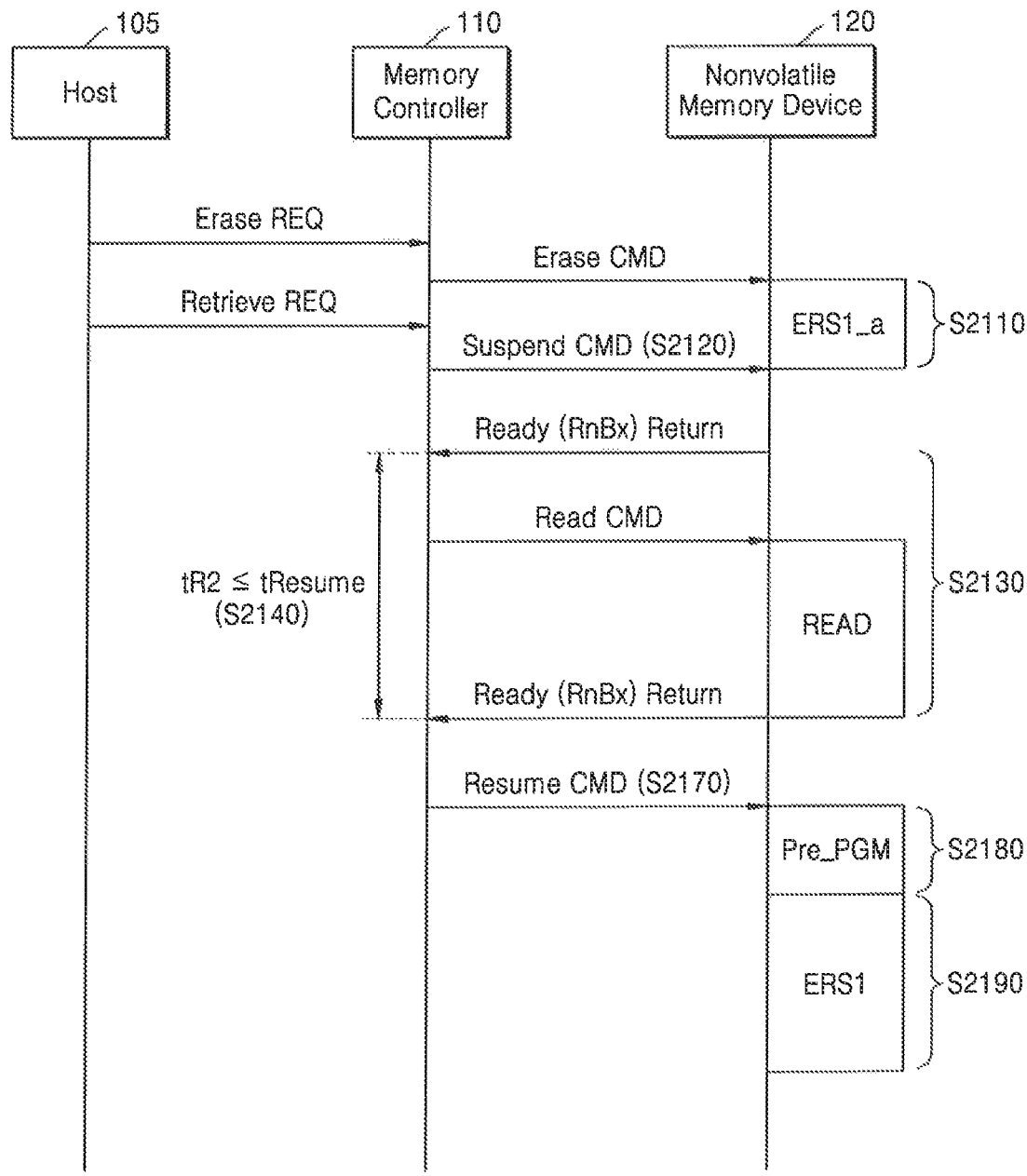

FIGS. 22 and 23 are diagrams for describing an erase method of FIG. 21, according to an exemplary embodiment of the inventive concept.

Referring to FIG. 22, in operation S2110, the memory controller 110 may issue an erase command to the nonvolatile memory device 120, according to an erase request from the host 105, and the nonvolatile memory device 120 may perform a first erase operation ERS1_a for one memory block in response to the erase command.

In operation S2120, the memory controller 110 may receive a retrieve request from the host 105 during the first erase operation ERS1_a, and may issue a suspend command to the nonvolatile memory device 120.

The nonvolatile memory device 120 may perform a suspend operation to temporarily suspend the first erase operation ERS1_a in response to the suspend command and may output a ready/busy signal RnBx in a ready state to the memory controller 110. The memory controller 110 may issue a read command to the nonvolatile memory device 120 for data retrieval. In operation S2130, the nonvolatile memory device 120 may perform a read operation in response to the read command, and when the read operation terminates, the nonvolatile memory device 120 may output the ready/busy signal RnBx in a busy state to the memory controller 110.

In operation S2140, the memory controller 110 may determine whether a resume time tResume from after the first erase operation ERS1_a is suspended until the first erase operation ERS1_a resumes has elapsed as much as a reference time tR2.

In operation S2150, when the resume time tResume is not greater than the reference time tR2, the memory controller 110 may issue a resume command RS CMD to the nonvolatile memory device 120. In operation S2160, following the suspended first erase operation ERS1_a, the nonvolatile memory device 120 may perform a remaining portion ERS1_b of the erase operation for the same first memory block BLK1 in response to the resume command RS CMD.

Referring to FIG. 23, compared with FIG. 22, there is additionally shown succeeding operations (operation S2170, S2180, and S2190) after the determining operation (operation S2140) of the resume time tResume. Since the other operations are the same as those shown in FIG. 22, they may not be described with reference to FIG. 23.

In FIG. 23, when the resume time tResume is equal to or greater than the reference time tR2 in operation S2140, the memory controller 110 may ignore the suspended first erase operation ERS1_a. In operation S2170, the memory controller 110 may issue a resume command RS CMD to the nonvolatile memory device 120, to again perform an erase operation for the first memory block BLK1.

In operation S2180, the nonvolatile memory device 120 may perform a pre-program operation Pre_PGM on the first memory block BLK1 in response to the resume command RS CMD. In operation S2190, after the pre-program operation Pre_PGM, the nonvolatile memory device 120 may complete an erase operation ERS1 for the first memory block BLK1 by performing a plurality of erase loops EL1 to ELm.

It has been described in the above embodiment of FIGS. 21 to 23 that the memory controller 110 may control a nonvolatile memory device according to whether a resume time tResume has elapsed as much as a reference time tR2 for erase reliability. When the resume time tResume is not greater than the reference time tR2, the memory controller 110 controls a suspended first erase operation so that the suspended first erase operation resumes. When the resume time tResume is equal to or greater than the reference time tR2, the memory controller 110 may ignore the suspended first erase operation and may control a first erase operation to be performed again by using a pre-program erase method.

Figure 24:
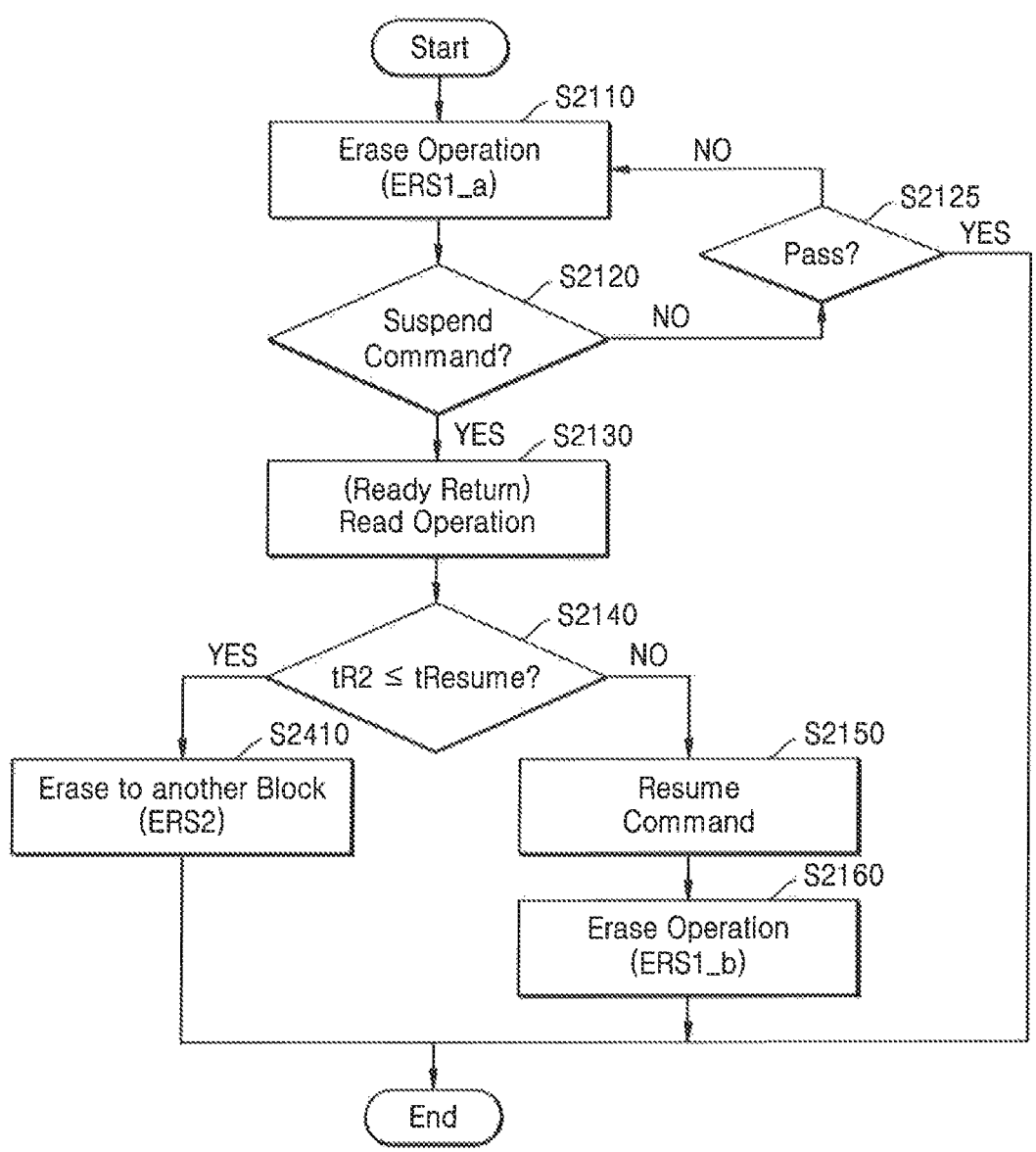
FIGS. 24 and 25 are diagrams of an erase method of a nonvolatile memory device, according to an exemplary embodiment of the inventive concept.
Figure 25:
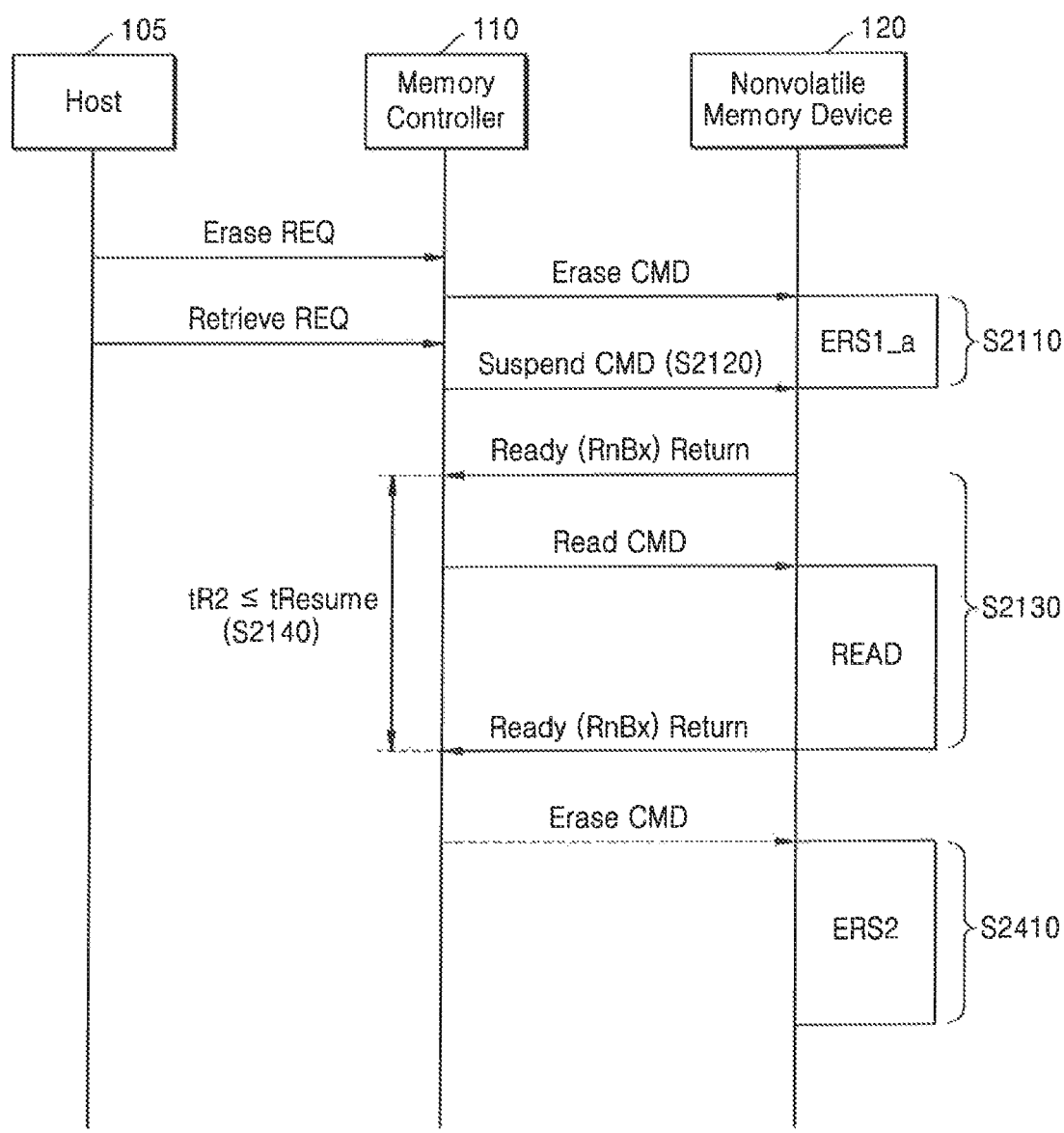

FIGS. 24 and 25 are diagrams of an erase method of a nonvolatile memory device, according to an exemplary embodiment of the inventive concept.

Referring to FIGS. 24 and 25, the erase method does not show steps S2710 to S2190 of FIG. 21. Since the other operations are the same as those shown in FIG. 21, they may not be described with reference to FIGS. 24 and 25.

When the resume time tResume is determined to be equal to or greater than the reference time tR2 in operation S2140, the memory controller 110 may perform a second erase operation ERS2 regarding another memory block in operation S2410. For example, the memory controller 110 may transmit an erase command including a new address ADDR to the nonvolatile memory device 120. The nonvolatile memory device 120 may select another memory block based on the received new address ADDR and may perform a second erase operation ERS2 and apply an erase pulse Vers and a verify voltage Vve to the other memory block.

In the embodiment of FIGS. 24 and 25, when the resume time tResume is equal to or greater than the reference time tR2, the memory controller 110 may ignore a suspended first erase operation and may control a new second erase operation ERS2 so that the new second erase operation ERS2 is performed.

Figure 26:
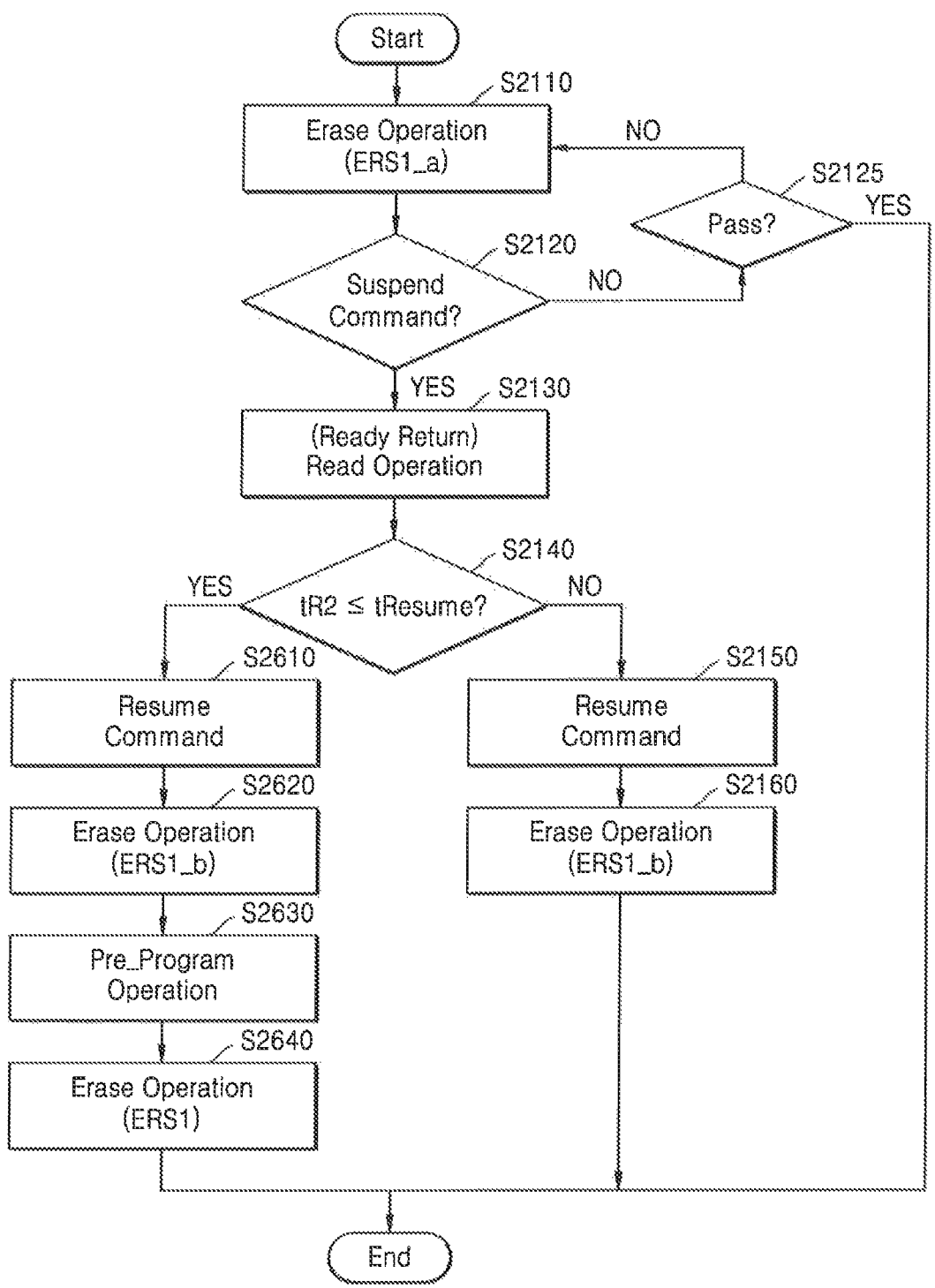
FIGS. 26 and 27 are diagrams of an erase method of a nonvolatile memory device, according to an exemplary embodiment of the inventive concept.
Figure 27:
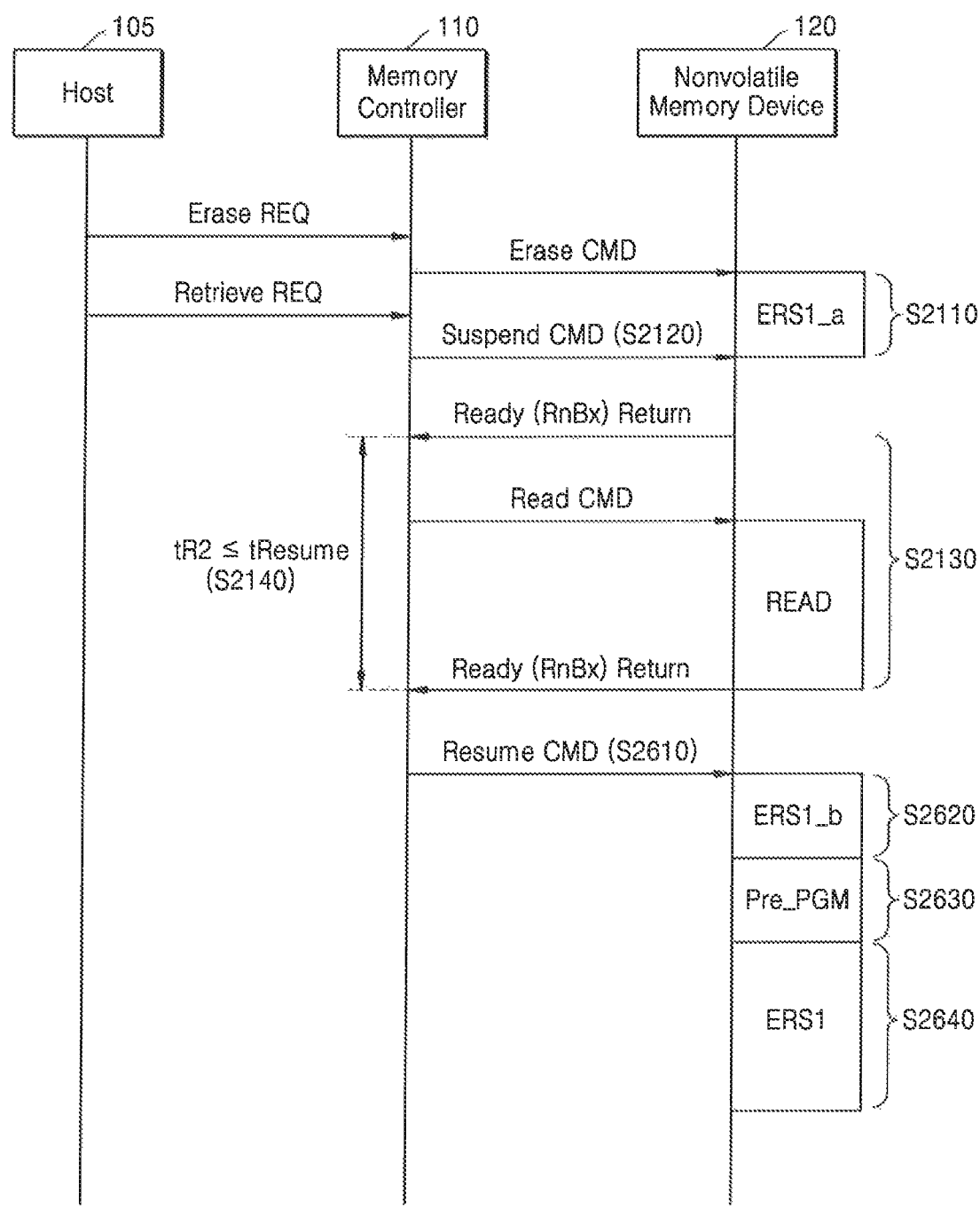

FIGS. 26 and 27 are diagrams of an erase method of a nonvolatile memory device according to an exemplary embodiment of the inventive concept.

Referring to FIGS. 26 and 27, the erase method includes additional steps with respect to the erase method of FIG. 21 (e.g., operations S2610 to S2640). Since the other operations are the same as those shown in FIG. 21, they may not be described with reference to FIGS. 26 and 27.

The memory controller 110 may issue a resume command RS CMD to the nonvolatile memory device 120 in operation S2610. In operation S2620, in response to the resume command RS CMD, following a suspended erase operation ERS1_a, the nonvolatile memory device 120 may apply an erase pulse Vers and a verify voltage Vve to the first memory block BLK1 and perform a remaining portion ERS1_b of an erase operation.

In operation S2630, the memory controller 110 may ignore the suspended and resumed erase operation ERS1_a and ERS1_b of the nonvolatile memory device 120 for the first memory block BLK1 and may again perform the erase operation for the first memory block BLK1. Accordingly, the nonvolatile memory device 120 may perform a pre-program operation Pre_PGM on the first memory block BLK1. In operation S2640, after the pre-program operation Pre_PGM for the first memory block BLK1, the nonvolatile memory device 120 may complete the erase operation for the first memory block BLK1 by performing a plurality of erase loops EL1 to ELm.

In the embodiment of FIGS. 26 and 27, when the resume time tResume is equal to or greater than the reference time tR2, the memory controller 110 may resume a suspended first erase operation, and then, may control a first erase operation ERS1 so that the first erase operation ERS1 is performed again by using a pre-program erase method.

Figure 28:
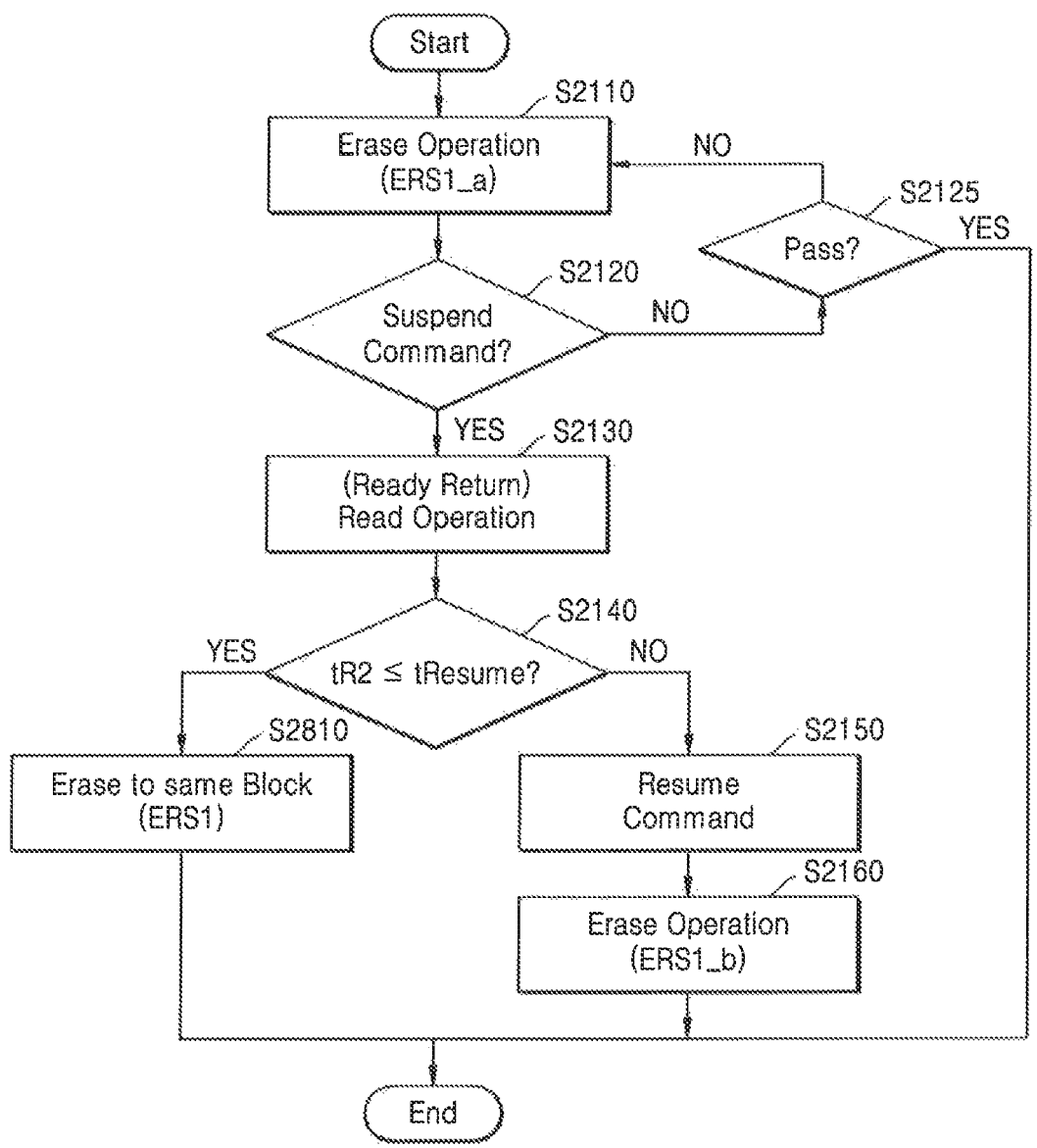
FIGS. 28 and 29 are diagrams of an erase method of a nonvolatile memory device, according to an exemplary embodiment of the inventive concept.
Figure 29:
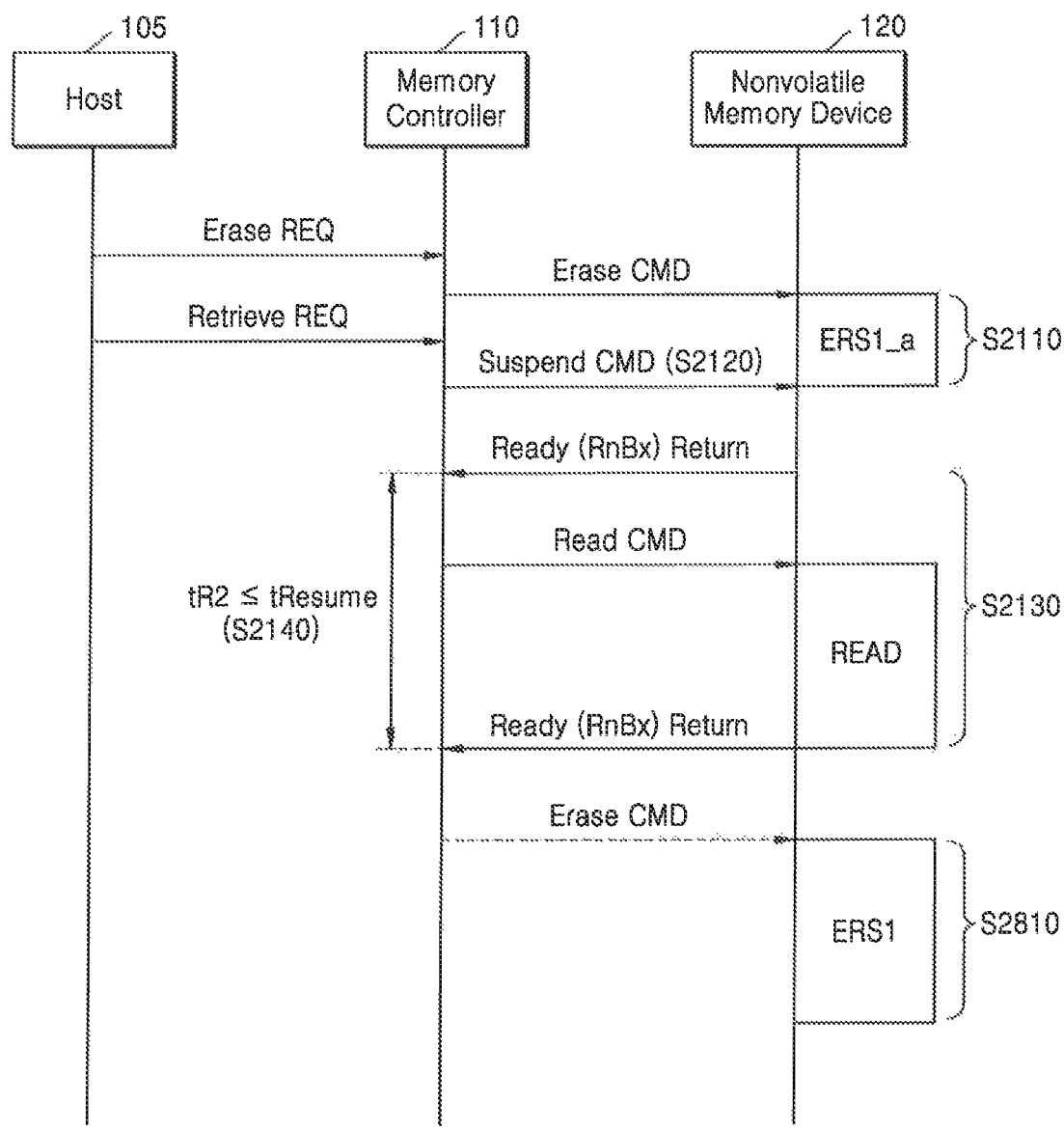

FIGS. 28 and 29 are diagrams of an erase method of a nonvolatile memory device, according to an exemplary embodiment of the inventive concept.

Referring to FIGS. 28 and 29, the erase method is different from the erase method of FIG. 21 with regard to operation S2810. Since the other operations are the same as those shown in FIG. 21, they may not be described with reference to FIGS. 28 and 29.

In operation S2810, the memory controller 110 may ignore the suspended first erase operation ERS1_a of the nonvolatile memory device 120 and may reperform an erase operation on the first memory block BLK1. Accordingly, the nonvolatile memory device 120 may complete an erase operation ERS1 on the first memory block BLK1 by performing a plurality of erase loops EL1 to ELm on the first memory block BLK1.

In the embodiment of FIGS. 28 and 29 described above, when the resume time tResume is equal to or greater than the reference time tR2, the memory controller 110 may ignore a suspended first erase operation and may control a first erase operation ERS1, which include the suspended first erase operation, so that the first erase operation ERS1 is reperformed from the beginning.

Figure 30:
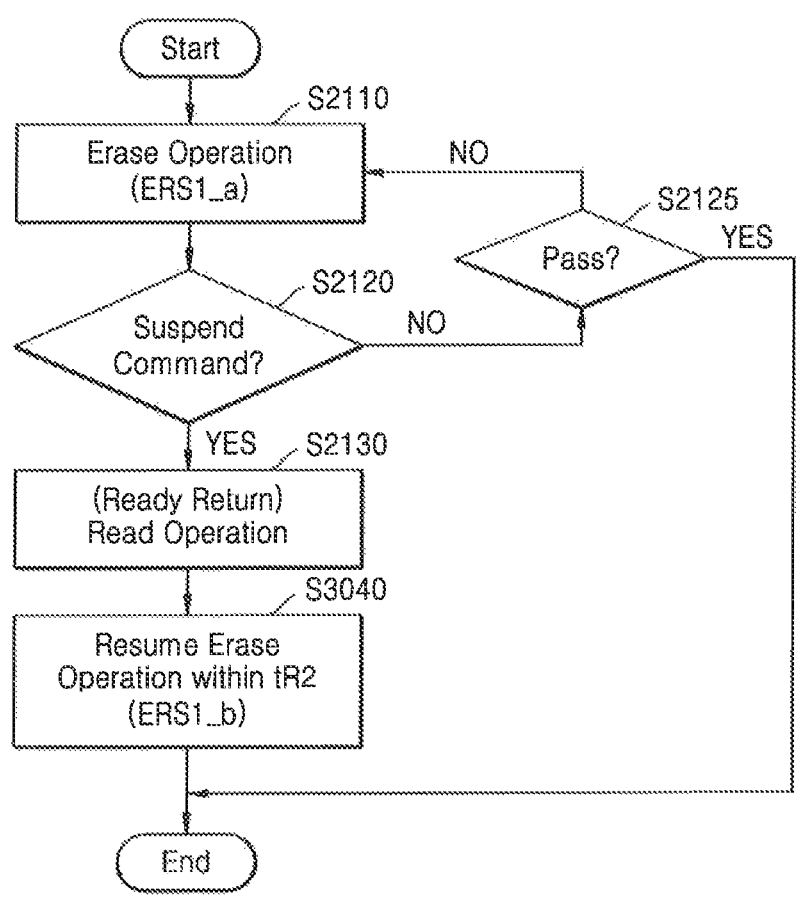
FIG. 30 is a flowchart of an erase operation of a nonvolatile memory device, according to an exemplary embodiment of the inventive concept.

FIG. 30 is a flowchart of an erase operation of a nonvolatile memory device, according to an exemplary embodiment of the inventive concept.

Referring to FIG. 30 in association with FIGS. 1 and 20, an erase method of FIG. 30 is different from the erase method of FIG. 21 in that operation S3040 replaces operation S2140, but the other operations are the same. Hereinafter, a difference with FIG. 21 will be mainly described.

Operations S2110 to S2130 described with reference to FIG. 21 are performed. Afterwards, in operation S3040, the memory controller 110 may resume a suspended erase operation of the nonvolatile memory device 120 within a reference time tR2 for erase reliability. Accordingly, following the suspended erase operation, the nonvolatile memory device 120 may apply an erase pulse Vers and an erase verify voltage Vve to a selected memory block and perform a remaining portion ERS_b of an erase operation of memory cells of the selected memory block, thereby completing the erase operation.

In the embodiment of FIG. 30, the memory controller 110 may resume a suspended erase operation within a reference time tR2 and complete an erase operation.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A programming method of a nonvolatile memory device including a plurality of wordlines stacked in a vertical direction on a substrate, the programming method comprising:
   initiating a first program operation;
   suspending the first program operation in response to a suspend command from a memory controller before completing the first program operation;
   comparing a first time with a reference time, the first time being a duration between suspending the first program operation and a resume operation, and when the first time is greater than the reference time, performing a second program operation and, when the first time is smaller than the reference time, receiving a resume command for completing the first program operation.

2. The programming method of claim 1, wherein the first time is greater than 1 ms.

3. The programming method of claim 1, wherein the reference time is between 100 μs and 1 ms.

4. The programming method of claim 1, wherein the initiating of the first program operation comprises performing a first portion of the first program operation, and
   the completing of the first program operation comprises performing a second portion of the first program operation.

5. The programming method of claim 1, further comprising:
   outputting a ready/busy signal having a first level when the first program operation is being performed; and
   outputting the ready/busy signal having a second level when the first program operation is suspended.

6. The programming method of claim 5, further comprising outputting the read/busy signal having the first level when the first program operation is resumed.

7. The programming method of claim 1, further comprising:
   changing a level of a ready/busy signal from a first level to a second level;
   receiving a read command from the memory controller; and
   performing a read operation when the ready/busy signal has the second level.

8. The programming method of claim 7, further comprising:
   changing the level of the ready/busy signal from the second level to the first level,
   wherein the second program operation is performed when the ready/busy signal has the first level.

9. The programming method of claim 7, wherein a read enable signal is toggled by the memory controller during the read operation.

10. The programming method of claim 1, wherein the nonvolatile memory device includes a plurality of memory cells, and the plurality of memory cells includes at least one multi-level cell.

11. A programming method of a nonvolatile memory device including a plurality of memory cells stacked in a vertical direction on a substrate, the programming method comprising:
    performing a first program operation;
    receiving a suspend command from a memory controller;
    suspending the first program operation in response to the suspend command;
    receiving a resume command from the memory controller;
    when a time between suspending the first program operation and receiving the resume command is greater than a reference time, resuming the first program operation; and
    after completing the first program operation, performing a second program operation.

12. The programming method of claim 11, wherein when the time between suspending the first program operation and receiving the resume command is less than the reference time, the first program operation is resumed.

13. The programming method of claim 11, wherein the time between suspending the first program operation and receiving the resume command is greater than 1 ms.

14. The programming method of claim 11, further comprising:
    performing a read operation when the first program operation is suspended.

15. The programming method of claim 11, further comprising:
    outputting a ready/busy signal in a ready state to the memory controller when the first program operation is suspended.

16. The programming method of claim 11, further comprising:
    reading data from a first page that was suspended in the first program operation; and
    detecting and correcting an error in the data read from the first page.

17. The programming method of claim 16, wherein the second program operation is performed on a second page.

18. The programming method of claim 11, wherein the plurality of memory cells includes at least one multi-level cell.

19. A programming method of a nonvolatile memory device including a plurality of wordlines stacked in a vertical direction between a string selection line and a ground selection line, the programming method comprising:
    performing a first program operation to a first selected word line in response to a first program command received from a memory controller;
    suspending the first program operation in response to a suspend command received from the memory controller;
    performing a read operation in response to a read command received from the memory controller;
    comparing a read time with a reference time, the read time being a duration between suspending the first program operation and completing the read operation,
    when the read time is less than the reference time, resuming the first program operation, and
    when the read time is greater than the reference time, performing a second program operation to a second selected word line in response to a second program command received from the memory controller.

20. The programming method of claim 19, wherein the first program operation is resumed in response to a resume command received from the memory controller.

21. The programming method of claim 19, wherein the read time occurs when a ready/busy signal output from the nonvolatile memory device has a ready state.

22. The programming method of claim 21, wherein when the read operation is completed the ready/busy signal output from the nonvolatile memory device has a busy state.

23. The programming method of claim 21, wherein the read time is greater than 1 ms.

24. The programming method of claim 19, wherein the nonvolatile memory device includes a plurality of memory cells, and the plurality of memory cells includes at least one multi-level cell.

25. A method of operating a memory system including a nonvolatile memory device and a memory controller, the method comprising:
receiving, at the memory controller, a write request from a host;
transmitting a first program command from the memory controller to the nonvolatile memory device;
performing, at the nonvolatile memory device, a first program operation for a first page in response to the first program command;
receiving, at the memory controller, a retrieve request from the host;
transmitting a suspend command from the memory controller to the nonvolatile memory device;
stopping the first program operation, at the nonvolatile memory device, in response to the suspend command;
transmitting a read command from the memory controller to the nonvolatile memory device while the first program operation is stopped;
performing, at the nonvolatile memory device, a read operation in response to the read command;
transmitting a second program command from the memory controller to the nonvolatile memory device, when a time elapsed since the first program operation is stopped is greater than a reference time; and
performing, at the nonvolatile memory device, a second program operation for a second page in response to the second program command.

26. The method of claim 25, further comprising:
outputting, from the nonvolatile memory device to the memory controller, a ready/busy signal having a first state after the suspend command is received; and
outputting, from the nonvolatile memory device to the memory controller, the ready/busy signal having a second state after data is read from the nonvolatile memory device.

27. The method of claim 25, wherein the time elapsed since the first program operation is stopped is greater than 1 ms.

28. The method of claim 25, wherein the nonvolatile memory device is a VNAND.

29. A programming method of a nonvolatile memory device including a plurality of wordlines stacked in a vertical direction on a substrate, the programming method comprising:
initiating a first program operation;
suspending the first program operation in response to a suspend command from a memory controller before completing the first program operation;
comparing a first time with a reference time, the first time corresponding to a ready state time of a ready/busy signal when the first program operation is suspended, and when the first time is greater than the reference time, performing a second program operation and, when the first time is smaller than the reference time, receiving a resume command for completing the first program operation.

* * * * *